(12) United States Patent
Ishida et al.

(10) Patent No.: US 12,457,786 B2
(45) Date of Patent: Oct. 28, 2025

(54) HIGH VOLTAGE FIELD EFFECT TRANSISTORS WITH DIFFERENT SIDEWALL SPACER CONFIGURATIONS AND METHOD OF MAKING THE SAME

(71) Applicant: WESTERN DIGITAL TECHNOLOGIES, INC., San Jose, CA (US)

(72) Inventors: Masashi Ishida, Yokkaichi (JP); Hiroyuki Ogawa, Nagoya (JP); Kiyokazu Shishido, Yokkaichi (JP); Kazutaka Yoshizawa, Yokkaichi (JP); Yasuyuki Aoki, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 364 days.

(21) Appl. No.: 18/358,653

(22) Filed: Jul. 25, 2023

(65) Prior Publication Data

US 2025/0040217 A1    Jan. 30, 2025

(51) Int. Cl.
*H01L 29/76* (2006.01)
*H10D 30/01* (2025.01)
(Continued)

(52) U.S. Cl.
CPC ....... *H10D 64/021* (2025.01); *H10D 30/0227* (2025.01); *H10D 30/603* (2025.01);
(Continued)

(58) Field of Classification Search
CPC ............ H10D 64/021; H10D 30/0227; H10D 30/603; H10D 84/83; H10D 84/017; H10D 84/0174; H10D 84/0184; H10D 62/307; H10D 84/013; H10D 30/0221; H10D 64/514; H10D 64/663; H10D 30/0212;
(Continued)

(56) References Cited

U.S. PATENT DOCUMENTS 9,859,422 B2 * 1/2018 Nishikawa ............. H10B 41/41
10,096,525 B2 * 10/2018 Lee ....................... H10D 64/258
(Continued)

OTHER PUBLICATIONS

U.S. Appl. No. 17/362,121, filed Jun. 29, 2021, SanDisk Technologies LLC.
(Continued)

*Primary Examiner* — Theresa T Doan
(74) *Attorney, Agent, or Firm* — THE MARBURY LAW GROUP PLLC

(57) ABSTRACT

A semiconductor structure includes a first field effect transistor including a first gate spacer having first laterally-straight bottom edges that coincide with top edges of first laterally-straight sidewalls of the first gate dielectric. The semiconductor structure further includes a second field effect transistor including a second gate dielectric that includes at least one discrete gate-dielectric opening that overlies a respective second active region, and a second gate spacer including a contoured portion that overlies and laterally surrounds a second gate electrode, and at least one horizontally-extending portion that overlies the second active region and including at least one discrete gate-spacer openings. The second field effect transistor may have a symmetric or non-symmetric configuration.

20 Claims, 28 Drawing Sheets

(51) Int. Cl.
*H10D 30/60* (2025.01)
*H10D 62/10* (2025.01)
*H10D 62/13* (2025.01)
*H10D 64/01* (2025.01)
*H10D 84/83* (2025.01)

(52) U.S. Cl.
CPC ......... *H10D 62/115* (2025.01); *H10D 62/151* (2025.01); *H10D 84/83* (2025.01)

(58) Field of Classification Search
CPC ........... H10D 84/0177; H10D 84/8312; H10D 84/83135; H10D 84/8316; H10D 84/856; H10D 30/0223
USPC ....................................................... 257/213
See application file for complete search history.

(56) References Cited

U.S. PATENT DOCUMENTS

| | | |
|---|---|---|
| 10,224,407 B2 | 3/2019 | Chowdhury et al. |
| 10,256,099 B1 | 4/2019 | Akaiwa et al. |
| 10,256,167 B1 | 4/2019 | Fukuo et al. |
| 10,319,635 B2 | 6/2019 | Nosho et al. |
| 11,309,402 B2 | 4/2022 | Amano et al. |
| 11,450,768 B2 | 9/2022 | Togo |
| 11,575,015 B2 | 2/2023 | Togo et al. |
| 11,626,496 B2 | 4/2023 | Akaiwa et al. |
| 2005/0035404 A1 | 2/2005 | Yu et al. |
| 2006/0113627 A1 | 6/2006 | Chen et al. |
| 2006/0145286 A1 | 7/2006 | Ohkawa et al. |
| 2007/0040210 A1 | 2/2007 | Matsunaga |
| 2010/0164018 A1 | 7/2010 | Lee et al. |
| 2018/0248013 A1 | 8/2018 | Chowdhury et al. |
| 2018/0331118 A1 | 11/2018 | Amano |
| 2018/0342455 A1 | 11/2018 | Nosho et al. |
| 2021/0242324 A1 | 8/2021 | Yao et al. |
| 2021/0280686 A1 | 9/2021 | Amano et al. |
| 2022/0109054 A1 | 4/2022 | Togo |
| 2022/0109070 A1 | 4/2022 | Ono et al. |
| 2022/0109071 A1 | 4/2022 | Togo |
| 2023/0163203 A1 | 5/2023 | Cheng et al. |
| 2023/0189533 A1 | 6/2023 | Wu et al. |

OTHER PUBLICATIONS

U.S. Appl. No. 17/496,099, filed Oct. 7, 2021, SanDisk Technologies LLC.
U.S. Appl. No. 17/496,122, filed Oct. 7, 2021, SanDisk Technologies LLC.
U.S. Appl. No. 17/529,802, filed Nov. 18, 2021, SanDisk Technologies LLC.
U.S. Appl. No. 17/821,273, filed Aug. 22, 2022, SanDisk Technologies LLC.
ISR-WO—International Search Report and Written Opinion of International Searching Authority for International Patent Application No. PCT/US2024/030421, mailed Aug. 22, 2024, 11 pages.
Karumuri, S. et al., "High Voltage Field Effect Transistors with Different Sidewall Spacer Configurations and Method of Making the Same," U.S. Appl. No. 18/358,633, filed Jul. 25, 2023.

* cited by examiner

HIGH VOLTAGE FIELD EFFECT TRANSISTORS WITH DIFFERENT SIDEWALL SPACER CONFIGURATIONS AND METHOD OF MAKING THE SAME

FIELD

The present disclosure relates generally to the field of semiconductor devices and specifically to high voltage field effect transistors with different sidewall spacer configurations and methods of making the same.

BACKGROUND

Prior art high voltage field effect transistors often suffer from surface breakdown voltage. Such transistors often have a complex extended low doped drain (LDD) to improve surface breakdown characteristics at the expense of process complexity and increased cost.

SUMMARY

According to an aspect of the present disclosure, a semiconductor structure comprises a first field effect transistor located over a substrate in a first device region and comprising first active regions laterally spaced from each other by a first semiconductor channel, a first gate dielectric overlying the first semiconductor channel, a first gate electrode overlying the first gate dielectric, and a first gate spacer having first laterally-straight outer sidewalls that have first laterally-straight bottom edges that coincide with top edges of first laterally-straight sidewalls of the first gate dielectric. The semiconductor structure also comprises a second field effect transistor located in a second device region of the substrate and comprising second active regions laterally spaced from each other by a second semiconductor channel, a second gate dielectric overlying the second semiconductor channel and the second active regions and including a pair of discrete gate-dielectric openings therethrough that overlie a respective one of the second active regions, a second gate electrode overlying the second gate dielectric, and a second gate spacer comprising a contoured portion that overlies a portion of a top surface of the second gate electrode and that laterally surrounds the second gate electrode; and horizontally-extending portions that overlie the second active regions and including a pair of discrete gate-spacer openings therethrough that overlie the pair of discrete gate-dielectric openings.

A method of forming a semiconductor structure is provided. The method comprises: forming shallow trench isolation structures in an upper portion of a semiconductor substrate; forming a first gate dielectric, a second gate dielectric, first active-region extensions, and second active-region extensions in the upper portion of the semiconductor substrate; forming a first gate electrode and a second gate electrode over the first gate dielectric and the second gate dielectric, respectively; conformally forming at least one gate spacer layer over the first gate electrode and the second gate electrode; and patterning the at least one gate spacer layer, the first gate dielectric, and the second gate dielectric to form a first gate spacer and a second gate spacer. A remaining portion of the first gate dielectric comprises two first laterally-straight sidewalls that laterally extend over, and overlie, the first active-region extensions, and are vertically coincident with two first laterally-straight outer sidewalls of the first gate spacer, and wherein a remaining portion of the second gate dielectric comprises two discrete gate-dielectric openings that underlie discrete gate-spacer openings in the second gate spacer, overlie the second active-region extensions, and are located entirely within an area of an opening in the shallow trench isolation structures.

According to yet another aspect of the present disclosure, another semiconductor structure comprises a first field effect transistor located over a substrate in a first device region and comprising first active regions laterally spaced from each other by a first semiconductor channel, a first gate dielectric overlying the first semiconductor channel, a first gate electrode overlying the first gate dielectric, and a first gate spacer having first laterally-straight outer sidewalls that have first laterally-straight bottom edges that coincide with top edges of first laterally-straight sidewalls of the first gate dielectric. The semiconductor structure also comprises a second field effect transistor located in a second device region of the substrate and comprising second active regions laterally spaced from each other by a second semiconductor channel, a second gate dielectric overlying the second semiconductor channel and the second active regions, a second gate electrode overlying the second gate dielectric, and a second gate spacer comprising: a first portion located on a first side of the second gate electrode and having a second laterally-straight outer sidewall that has a first laterally-straight bottom edge that coincides with a top edge of a second laterally-straight sidewall of the second gate dielectric; and a second portion located on a second side of the second gate electrode and having a contoured portion that overlies a portion of top surface of the second side of the second gate electrode and that laterally surrounds the second gate electrode, and a horizontally-extending portion that overlies one of the second active regions and including a discrete gate-spacer opening therethrough that overlies a discrete gate-dielectric opening through the second gate dielectric.

According to yet another aspect of the present disclosure, a method of forming a semiconductor structure is provided. The method comprises: forming shallow trench isolation structures in an upper portion of a semiconductor substrate; forming a first gate dielectric, a second gate dielectric, first active-region extensions, and second active-region extensions in the upper portion of the semiconductor substrate; forming a first gate electrode and a second gate electrode over the first gate dielectric and the second gate dielectric, respectively; conformally forming at least one gate spacer layer over the first gate electrode and the second gate electrode; and patterning the at least one gate spacer layer, the first gate dielectric, and the second gate dielectric to form a first gate spacer and a second gate spacer. A remaining portion of the first gate dielectric comprises two first laterally-straight sidewalls that laterally extend over and overlie the first active-region extensions and are vertically coincident with two first laterally-straight outer sidewalls of the first gate spacer. A remaining portion of the second gate dielectric comprises a second laterally-straight sidewall that laterally extends over and overlies one of the second active-region extensions and is vertically coincident with a second laterally-straight outer sidewall of the second gate spacer, and a discrete gate-dielectric opening that underlies a discrete gate-spacer opening in the second gate spacer and overlies another one of the second active-region extensions.

DETAILED DESCRIPTION

Figure 1A:
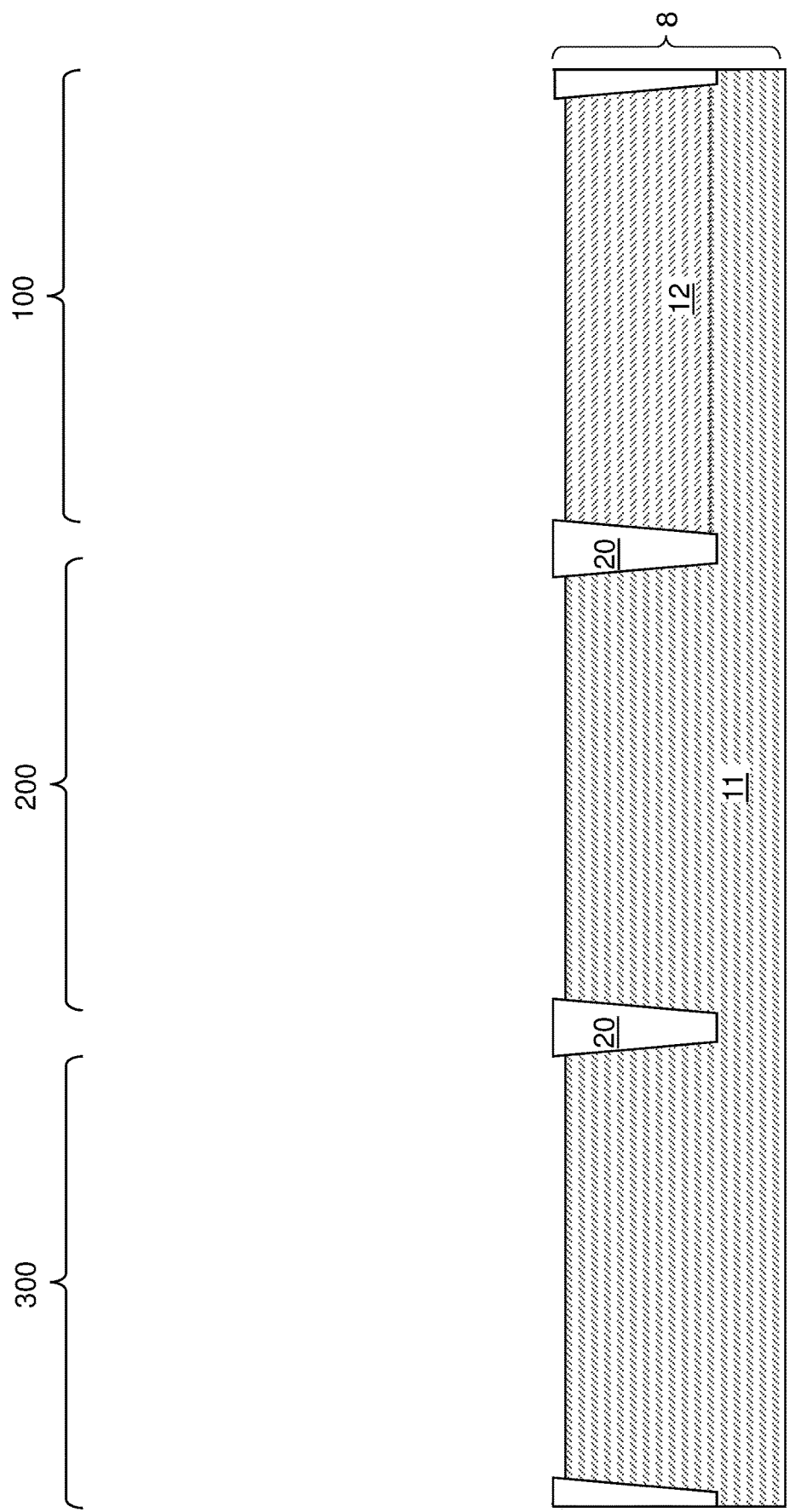
FIG. 1A is a vertical cross-sectional view of a first subset of device regions in an exemplary structure after formation of shallow trench isolation structures according to an embodiment of the present disclosure.

Embodiments of the present disclosure provide high voltage field effect transistors with different sidewall spacer configurations and methods of making the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material", "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active-region extension" refers to a source extension region or a drain extension region.

Many high voltage transistors have a reliability problem in which performance of the transistor degrades over time due to trapping of electrons in a silicon nitride gate sidewall spacer layer. Furthermore, when an additional silicide blocking silicon nitride layer is used in conjunction with metal silicide formation on the source and drain regions, this additional dielectric layer tends to worsen the reliability problem.

Embodiments of the present disclosure provide a semiconductor device including p-type and n-type high voltage transistors having different gate sidewall spacer structures from each other to improve the reliability of the device. Semiconductor gate electrodes can be selectively metallized and then annealed to form metal silicide low contact resistance and low leakage current gate contact structures. In some embodiments, an elongated silicon nitride sidewall spacer may be used in n-type high voltage transistors both as a partial silicide blocking structure and an ion implantation mask, while a narrower silicon nitride sidewall spacer may be used in p-type high voltage transistors as an ion implantation mask structure without blocking silicide formation, to improve the reliability of the device.

Figure 1B:
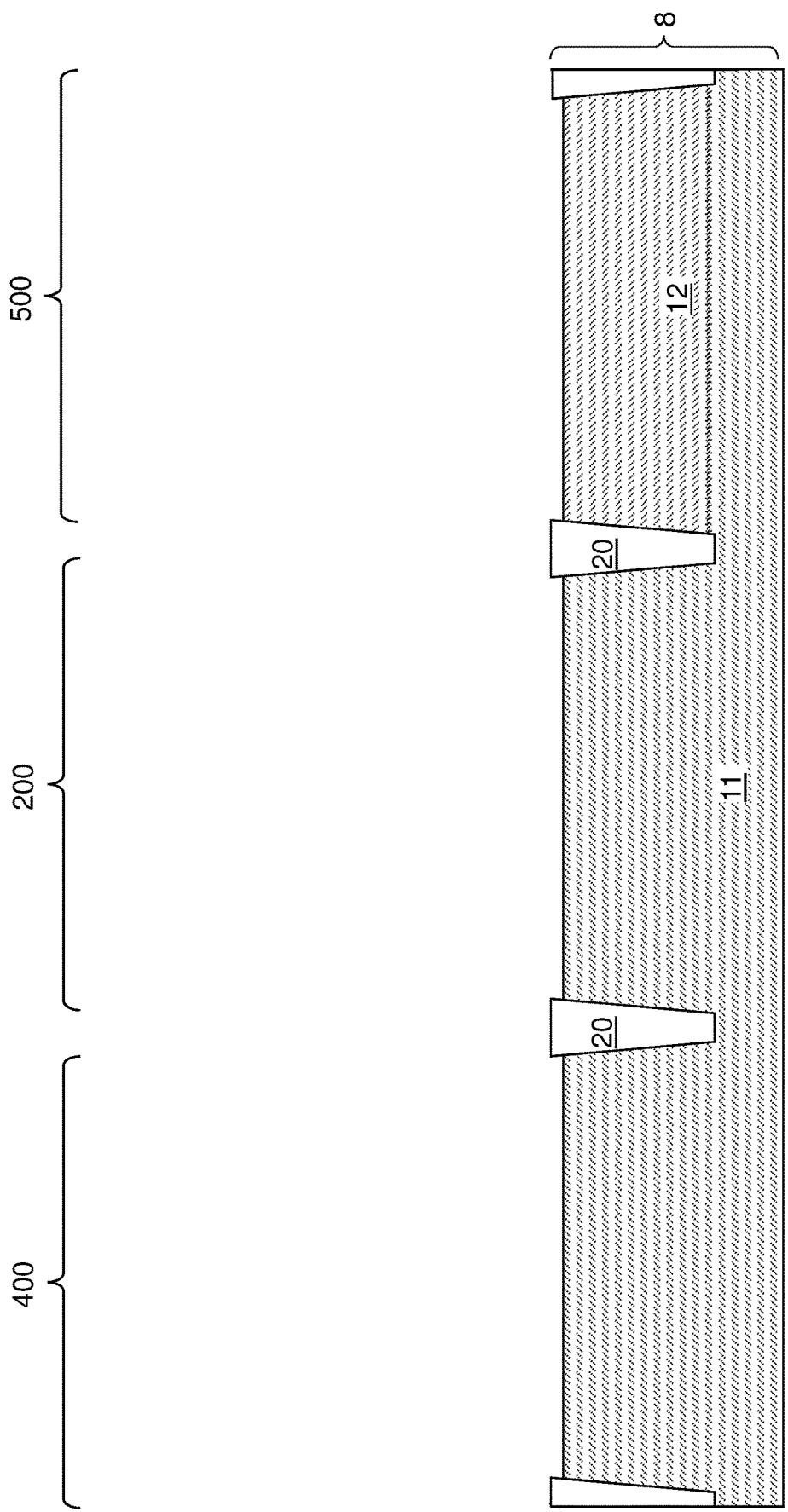
FIG. 1B is a vertical cross-sectional view of a second subset of the device regions in the exemplary structure of FIG. 1A.

Referring to FIGS. 1A and 1B, an exemplary structure according to an embodiment of the present disclosure is illustrated, which comprises a semiconductor substrate 8, shallow trench isolation structures 20 formed in an upper portion of the semiconductor substrate 8, and doped wells that can be formed in a subset of device regions. The semiconductor substrate 8 may be any semiconductor substrate known in the art. For example, the semiconductor substrate 8 may be a commercially available single-crystalline semiconductor substrate such as a single crystalline silicon wafer. The semiconductor substrate 8 may comprise a semiconductor material layer such as a first-conductivity-type semiconductor layer 11 having a doping of a first conductivity type at a first atomic concentration. The first conductivity type may be p-type or n-type, and the first atomic concentration may be in a range from $1.0 \times 10^{13}/\text{cm}^3$ to $1.0 \times 10^{17}/\text{cm}^3$, although lesser and greater atomic concentrations may also be employed.

The exemplary structure comprises at least one device region, which may comprise, for example, any combination of a first device region 100, a second device region 200, a third device region 300, a fourth device region 400, and a fifth device region 500. As noted above, the ordinals in the device names are merely for the purpose of counting, and does not constitute a portion of a name of an element. Likewise, ordinals attached to structural components of the present disclosure do not constitute portions of names of elements. As such, the ordinals assigned to elements in the claims of the instant application may, or may not, match the ordinals assigned to the same element in the specification, and the specification and the claims must be interpreted in light of possible changes in the ordinals assigned to elements.

FIGS. 1A and 1B show different subsets of the device regions (100, 200, 300, 400, 500) of the embodiments of the present disclosure. Device region 100 is used to form a high voltage p-type field effect transistor. Device region 200 is used to form a high voltage n-type field effect transistor. Device region 300 is used to form a low voltage n-type field effect transistor. Device region 400 is used to form an asymmetric low to high voltage n-type field effect transistor, which may be used as a bit line hook up transistor in a driver circuit of a memory device. Device region 500 is used to form another high voltage p-type field effect transistor.

FIG. 1A shows device regions 100, 200 and 300. FIG. 1B shows device regions 200, 400 and 500. In one embodiment, all five device regions (100, 200, 300, 400, 500) are located on the same substrate 8 and are fabricated using the steps described below with respect to all of the FIGS. 1A to 13B.

In another embodiment, the device regions 100, 200 and 300 of FIG. 1A are located on one substrate 8 and the device regions 200, 400 and 500 are located on a different substrate 8. Thus, in this embodiment, the high voltage n-type field effect transistor in device region 200 may be used in the same device as the high voltage p-type field effect transistor in device region 100 and the low voltage n-type transistor in device region 300, or the high voltage n-type field effect transistor in device region 200 may be used in the same device as the high voltage p-type field effect transistor in device region 500 and the asymmetric low to high voltage n-type field effect transistor in device region 400. Thus, the transistors in device regions 100, 200 and 300 may be fabricated on one substrate 8 using the steps described below with respect to the "A" numbered FIGS. 1A to 13A, while the transistors in device regions 200, 400 and 500 may be fabricated on a different substrate 8 using the steps described below with respect to the "B" numbered FIGS. 1B to 13B.

Each device region may be formed adjacent to any other device region. Thus, the lateral order of the illustrated set of device regions in FIGS. 1A and 1B can be arranged in any order. Further, any number of instances of the illustrated device regions may be repeated with or without modifications in the lateral directions. In one embodiment, one or more instances of each illustrated device region in FIGS. 1A and 1B may be provided over a same semiconductor substrate 8. Each device region may comprise a respective opening in shallow trench isolation structures in which a top surface segment of a semiconductor material in the semiconductor substrate 8 is physically exposed.

In one embodiment, doped wells, such as second-conductivity-type wells 12 having a doping of a second conductivity type, can be formed in a subset of the device regions. In the illustrated example, a second-conductivity-type well 12 can be formed in each of the first device region 100 and the fifth device region 500. The second conductivity type is the opposite of the first conductivity type. Each second-conductivity-type well 12 comprises dopants of the second conductivity type at a respective second atomic concentration, which may be in a range from $1.0 \times 10^{13}/cm^3$ to $1.0 \times 10^{17}/cm^3$, although lesser and greater atomic concentrations may also be employed. The first conductivity type may comprise p-type and the second-conductivity type may comprise n-type.

Figure 2A:
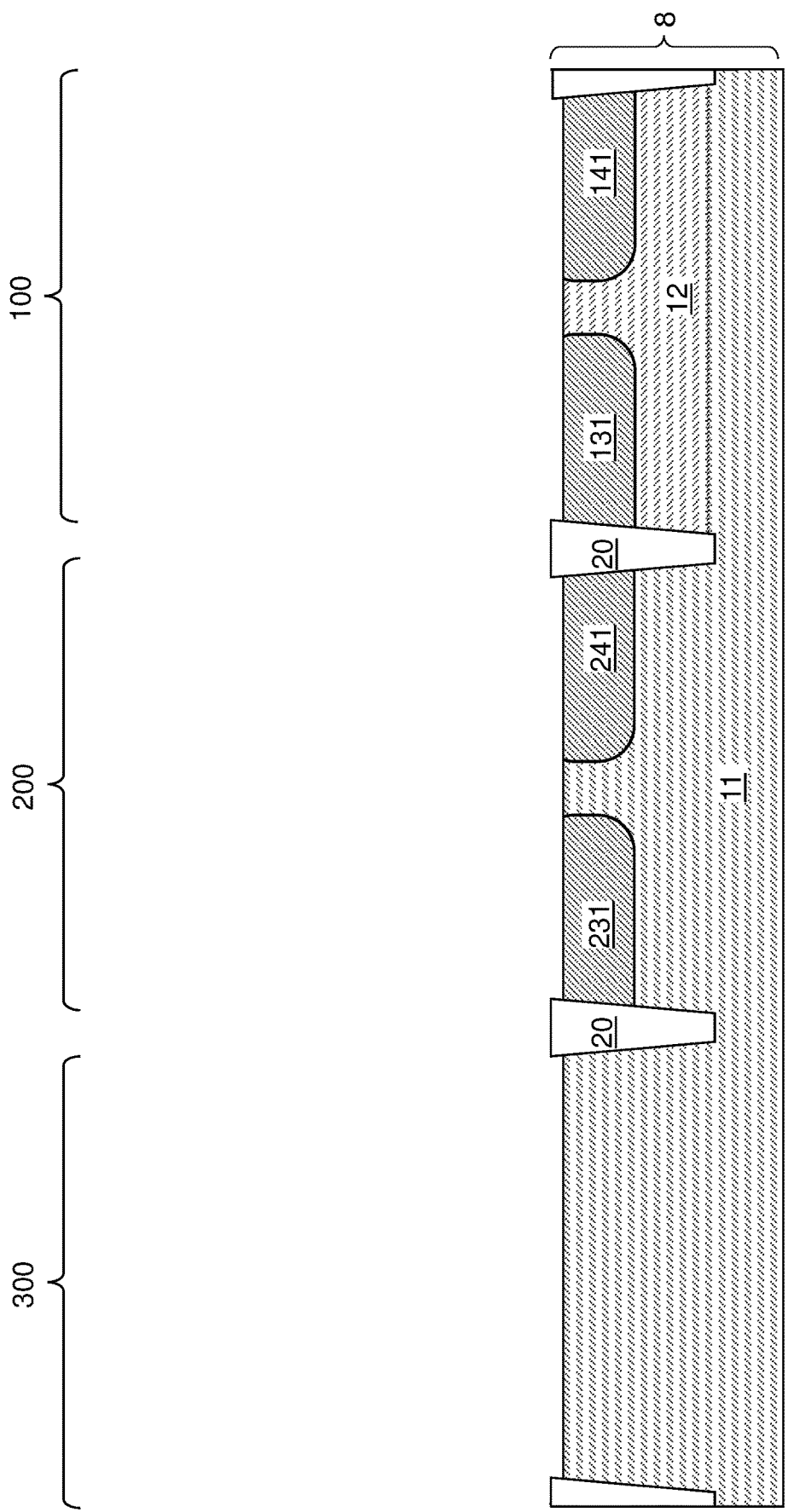
FIG. 2A is a vertical cross-sectional view of the first subset of the device regions of the exemplary after formation of active-region extensions according to an embodiment of the present disclosure.
Figure 2B:
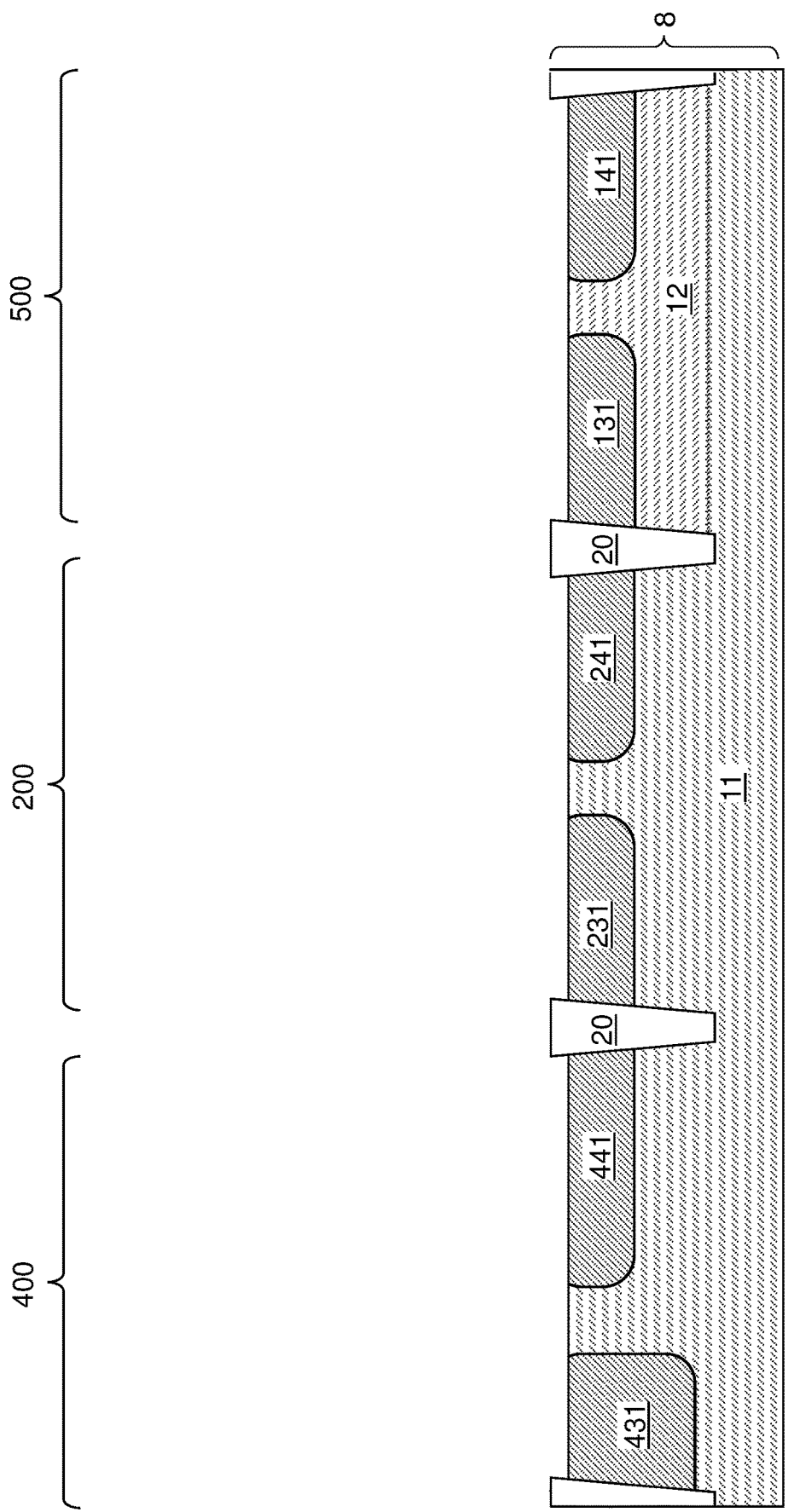
FIG. 2B is a vertical cross-sectional view of the second subset of the device regions in the exemplary structure of FIG. 2A.

Referring to FIGS. 2A and 2B, at least one photoresist layer (not shown) can be applied and patterned over the top surface of the semiconductor substrate 8, and can be lithographically patterned to cover a respective subset of the top surface segments of the semiconductor substrate 8. Dopants of the first conductivity type can be implanted employing a respective patterned photoresist layer as an implantation mask to form first-conductivity type doped semiconductor regions, which may comprise first-conductivity-type active-region extensions (131, 141) and first-conductivity-type wells (231, 241, 431, 441). Alternatively, the first-conductivity-type well 441 may be omitted.

The first-conductivity-type active-region extensions (131, 141) comprise first-conductivity-type doped regions that can be employed as source extension regions or drain extension regions if the source and drain regions will also have the first conductivity type. For example, the first-conductivity-type active-region extensions (131, 141) may comprise first-conductivity-type source extension regions 131 and first-conductivity-type drain extension regions 141.

The first-conductivity-type wells (231, 241, 431 and optionally 441) comprise various doped wells that can be employed to enhance performance of second-conductivity-type field effect transistors (e.g., n-type transistors) to be subsequently formed, i.e., field effect transistors including source/drain regions (which are herein collectively referred to as active regions) having a doping of the second conductivity type (e.g., n-type). For example, these wells may function as halo regions if the source and drain regions will have the second conductivity type. The first-conductivity-type wells (231, 241, 431, 441) may comprise source-side first-conductivity-type wells (231, 431) and drain-side first-conductivity-type wells (241, 441). As noted above, the first-conductivity-type well 441 may be omitted.

In one embodiment, a subset of the first-conductivity-type wells (231, 241, 441) may have the same depth and the same dopant concentration as the first-conductivity-type active-region extensions (131, 141), and may be formed by a same ion implantation process. In the illustrated example, a source-side first-conductivity-type well 231, drain-side first-conductivity-type wells (241, 441), and the first-conductivity-type active-region extensions (131, 141) may be formed by a same ion implantation process, and may have the same depth and the same dopant concentration of dopants of the first conductivity type.

In one embodiment, the first-conductivity-type well 431 may be formed separately using a different patterned photoresist layer than the remaining first-conductivity-type active-region extensions (131, 141) and first-conductivity-type wells (231, 241, and optionally 441). A higher ion energy implant may be used to form the first-conductivity-type well 431 than the remaining first-conductivity-type active-region extensions (131, 141) and first-conductivity-type wells (231, 241, and optionally 441). In this embodiment, the first-conductivity-type well 431 extends deeper into the substrate 8 than the remaining first-conductivity-type active-region extensions (131, 141) and first-conductivity-type wells (231, 241, and optionally 441).

Generally, the first-conductivity-type active-region extensions (131, 141) and first-conductivity-type wells (231, 241, 431, 441) comprise dopants of the first conductivity type at a respective third atomic concentration, which may be in a range from $1.0 \times 10^{14}/cm^3$ to $3.0 \times 10^{18}/cm^3$, although lesser and greater atomic concentrations may also be employed. The depth of each of the first-conductivity-type active-region extensions (131, 141) and first-conductivity-type wells (231, 241, 431, 441) may be in a range from 50 nm to 400 nm, although lesser and greater depths may also be employed.

Figure 3A:
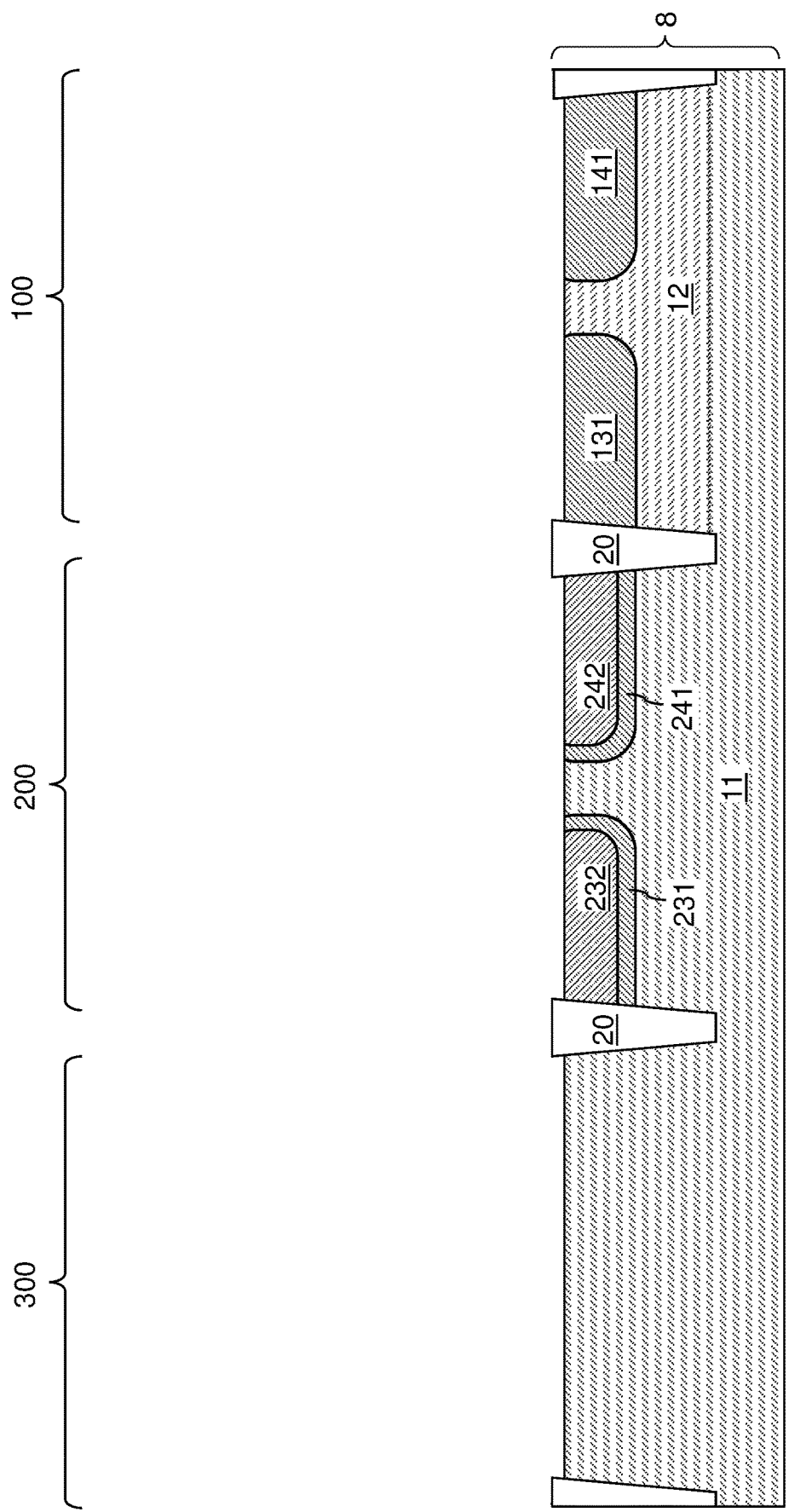
FIG. 3A is a vertical cross-sectional view of the first subset of the device regions in the exemplary structure after formation of additional active-region extensions according to an embodiment of the present disclosure.
Figure 3B:
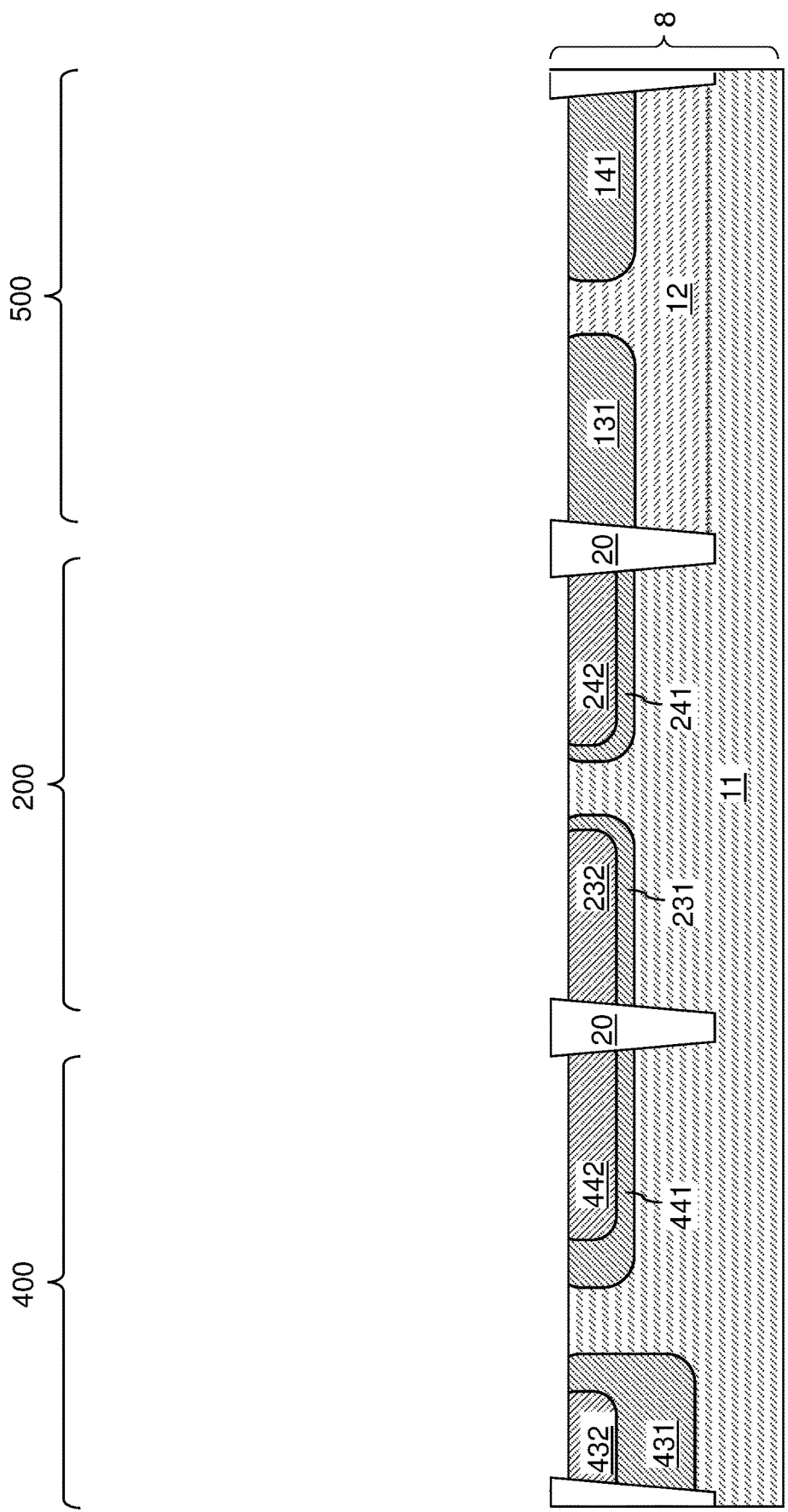
FIG. 3B is a vertical cross-sectional view of the second subset of the device regions in the exemplary structure of FIG. 3A.

Referring to FIGS. 3A and 3B, at least one photoresist layer (not shown) can be applied and patterned over the top surface of the semiconductor substrate 8, and can be lithographically patterned to cover a respective subset of the top surface segments of the semiconductor substrate 8 in device regions 100 and 300. Dopants of the second conductivity type can be implanted employing a respective patterned photoresist layer as an implantation mask to form second-conductivity type doped semiconductor regions, which may comprise second-conductivity-type active-region extensions (232, 242, 432, 442) in device regions 200 and 400.

The second-conductivity-type active-region extensions (232, 242, 432, 442) comprise second-conductivity-type doped regions that can be employed as source extension regions or drain extension regions. For example, the second-conductivity-type active-region extensions (232, 242, 432, 442) may comprise second-conductivity-type source extension regions (232, 432) and second-conductivity-type drain extension regions (242, 442). In one embodiment, the second-conductivity-type source extension regions (232, 432) may be formed entirely within a volume of a respective one of the source-side first-conductivity-type wells (231, 431), and the second-conductivity-type drain extension regions (242, 442) may be formed entirely within a volume of a respective one of the drain-side first-conductivity-type wells (241, 441). In this case, each of the second-conductivity-type source extension regions (232, 432) and the second-conductivity-type drain extension regions (242, 442) may be a lesser depths than a respective one of the source-side first-conductivity-type wells (231, 431), or than a respective one of the drain-side first-conductivity-type wells (241, 441).

Generally, the second-conductivity-type active-region extensions (232, 242, 432, 442) comprise dopants of the second conductivity type at a respective fourth atomic concentration, which may be in a range from $1.0 \times 10^{14}/cm^3$ to $3.0 \times 10^{18}/cm^3$, although lesser and greater atomic concentrations may also be employed. The depth of each of the second-conductivity-type active-region extensions (232, 242, 432, 442) may be in a range from 30 nm to 200 nm, although lesser and greater depths may also be employed.

Figure 4A:
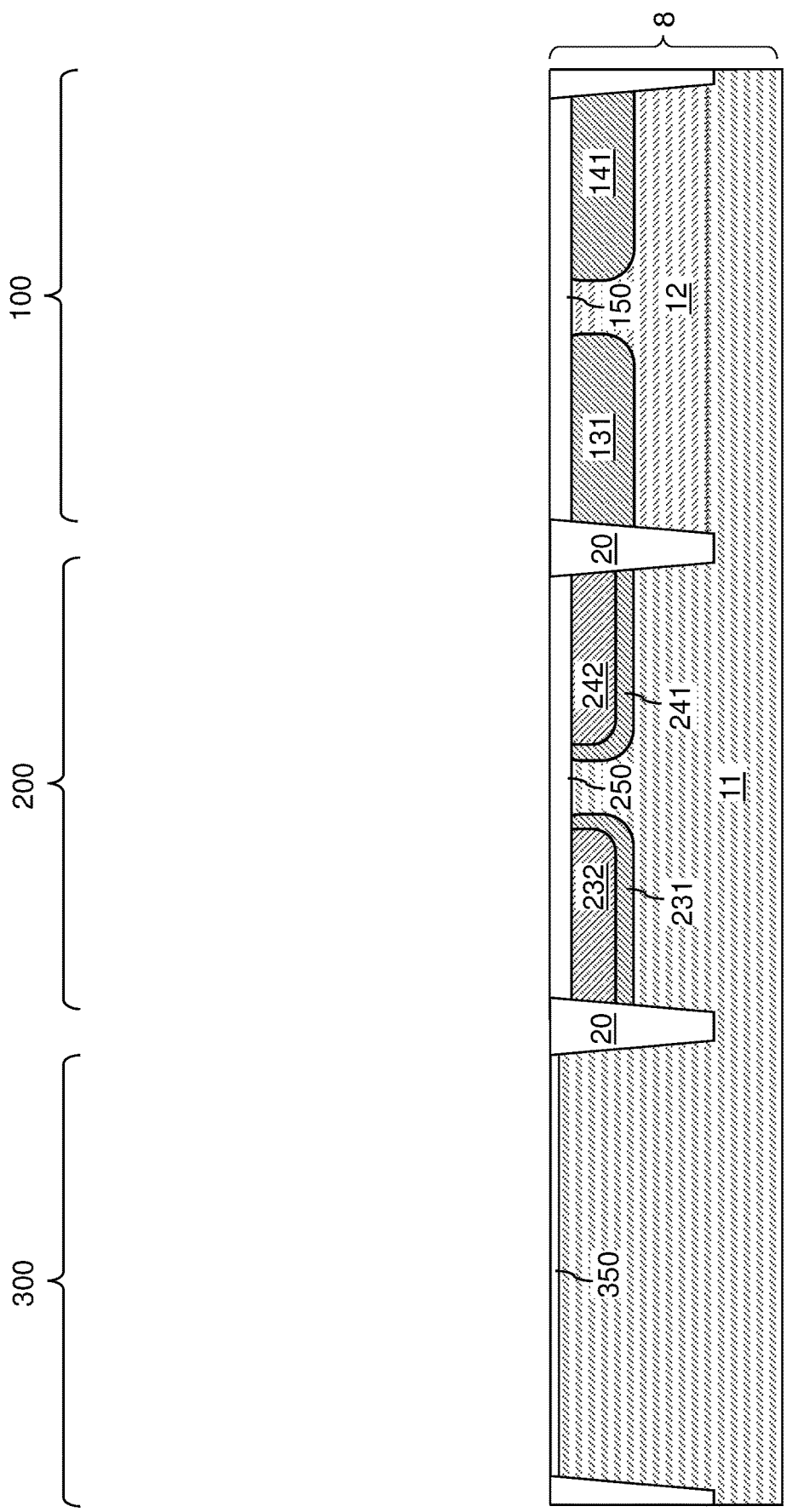
FIG. 4A is a vertical cross-sectional view of the first subset of the device regions in the exemplary structure after formation of gate dielectrics according to an embodiment of the present disclosure.
Figure 4B:
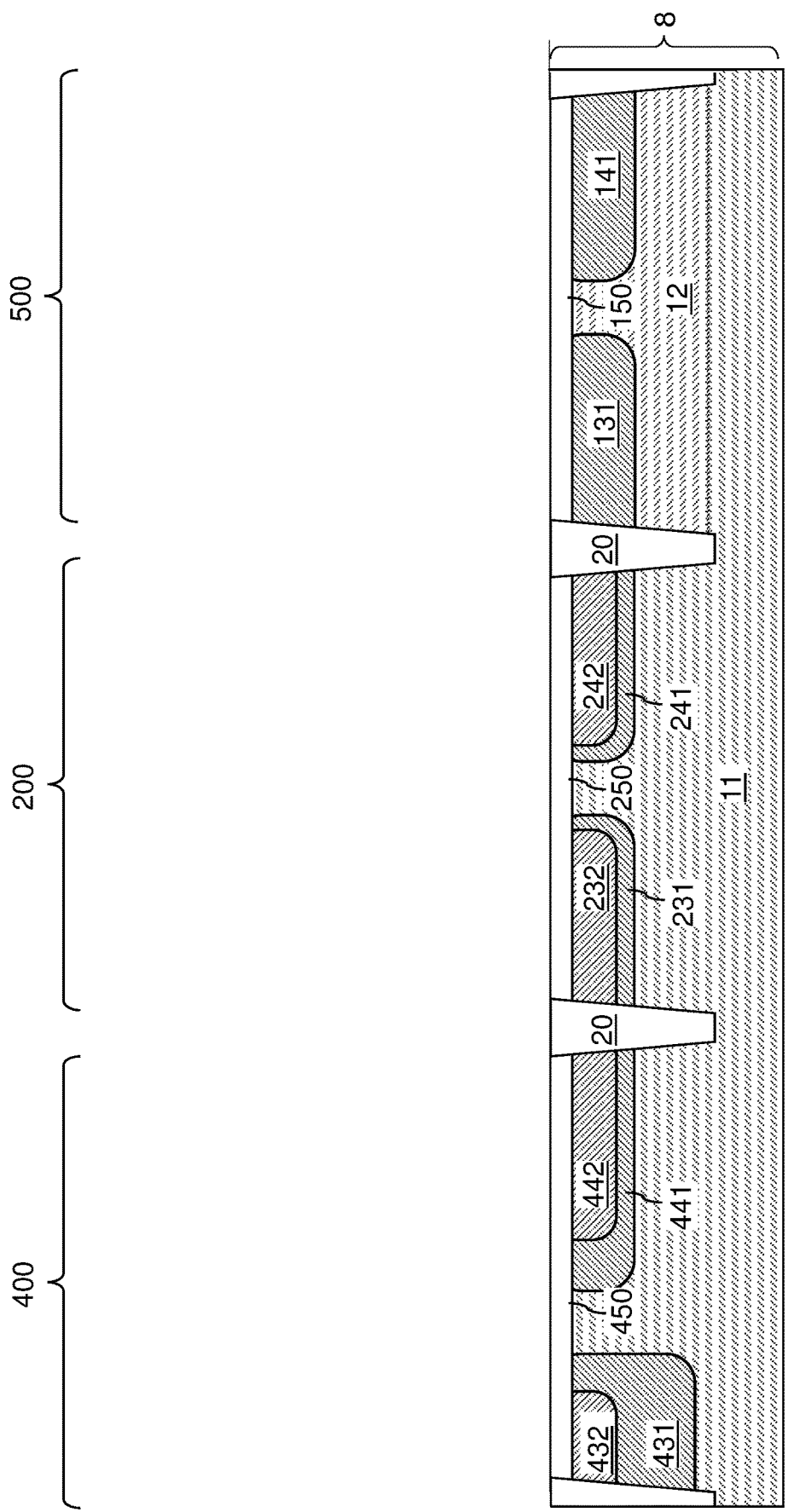
FIG. 4B is a vertical cross-sectional view of the second subset of the device regions in the exemplary structure of FIG. 4A.

Referring to FIGS. 4A and 4B, gate dielectrics (150, 250, 350, 450) may be formed in various device regions. The gate dielectrics (150, 250, 350, 450) may comprise a first gate dielectric 150 that is formed in the first device region 100, a second gate dielectric 250 that is formed in the second device region 200, a third gate dielectric 350 that is formed in the third device region 300, a fourth gate dielectric 450 that is formed in the fourth device region 400, and a fifth gate dielectric 150 (which may have the same material composition and the same thickness as the first gate dielectric 150) that is formed in the fifth device region 500. Thus, the fifth gate dielectric 150 in the fifth device region 500 may also be referred to as a first gate dielectric.

In an illustrative example, the gate dielectrics (150, 250, 350, 450) may comprise thicker gate dielectrics (such as the first gate dielectric 150, the second gate dielectric 250, and the fourth gate dielectric 450) that is employed to form high-voltage field effect transistors, and a thinner gate dielectric (such as the third gate dielectric 350) that is employed to form a low-voltage field effect transistor. The gate dielectrics (150, 250, 350, 450) may comprise any gate dielectric material known in the art, such as silicon oxide. The thickness of each thicker gate dielectric may be in a range from 20 nm to 100 nm, such as 50 nm to 50 nm, although lesser and greater thicknesses may also be employed. The thickness of each thinner gate dielectric may be in a range from 1 nm to 10 nm, such as 2 nm to 8 nm, although lesser and greater thicknesses may also be employed.

Figure 5A:
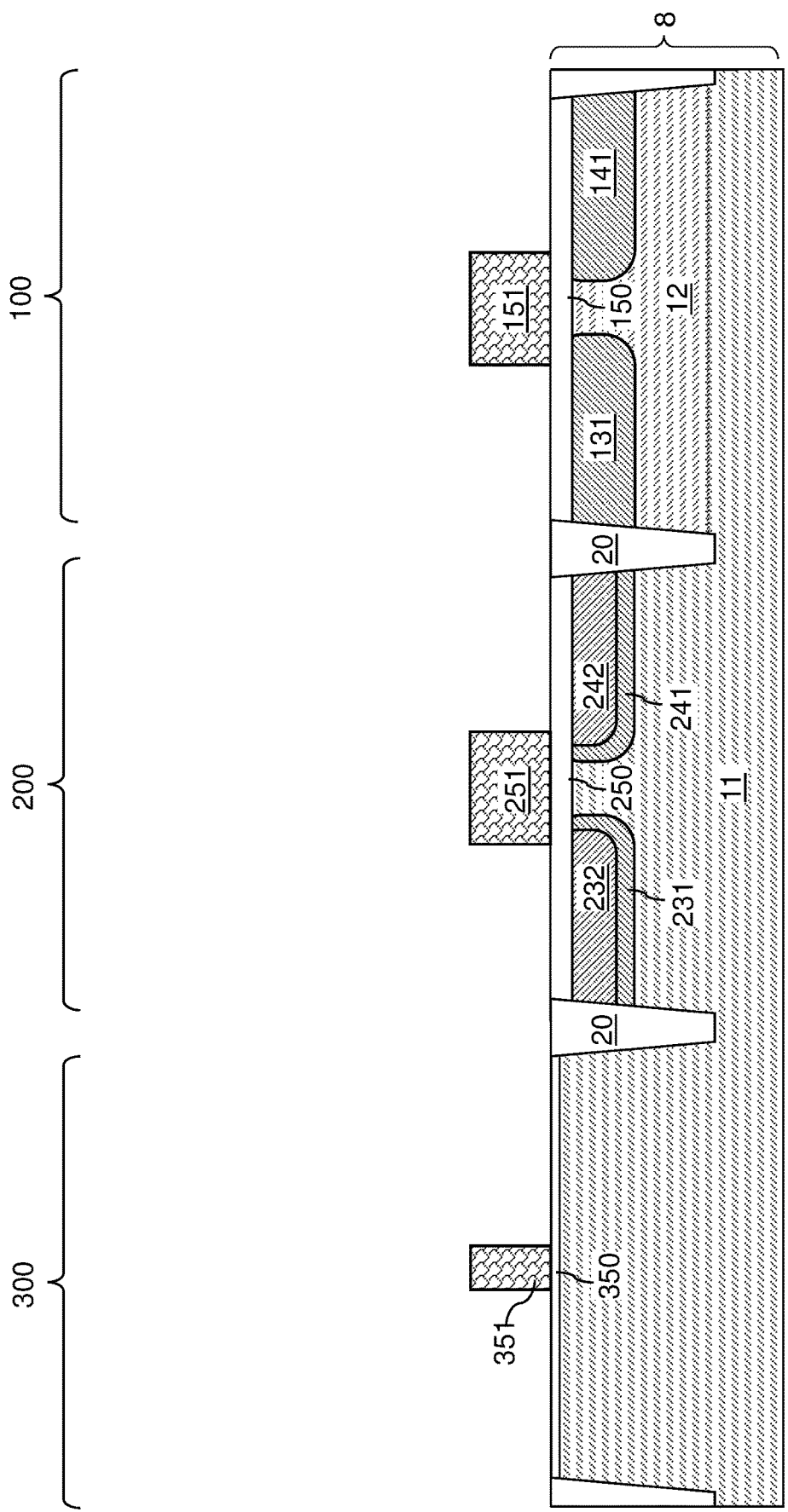
FIG. 5A is a vertical cross-sectional view of the first subset of the device regions in the exemplary structure after formation of gate electrodes according to an embodiment of the present disclosure.
Figure 5B:
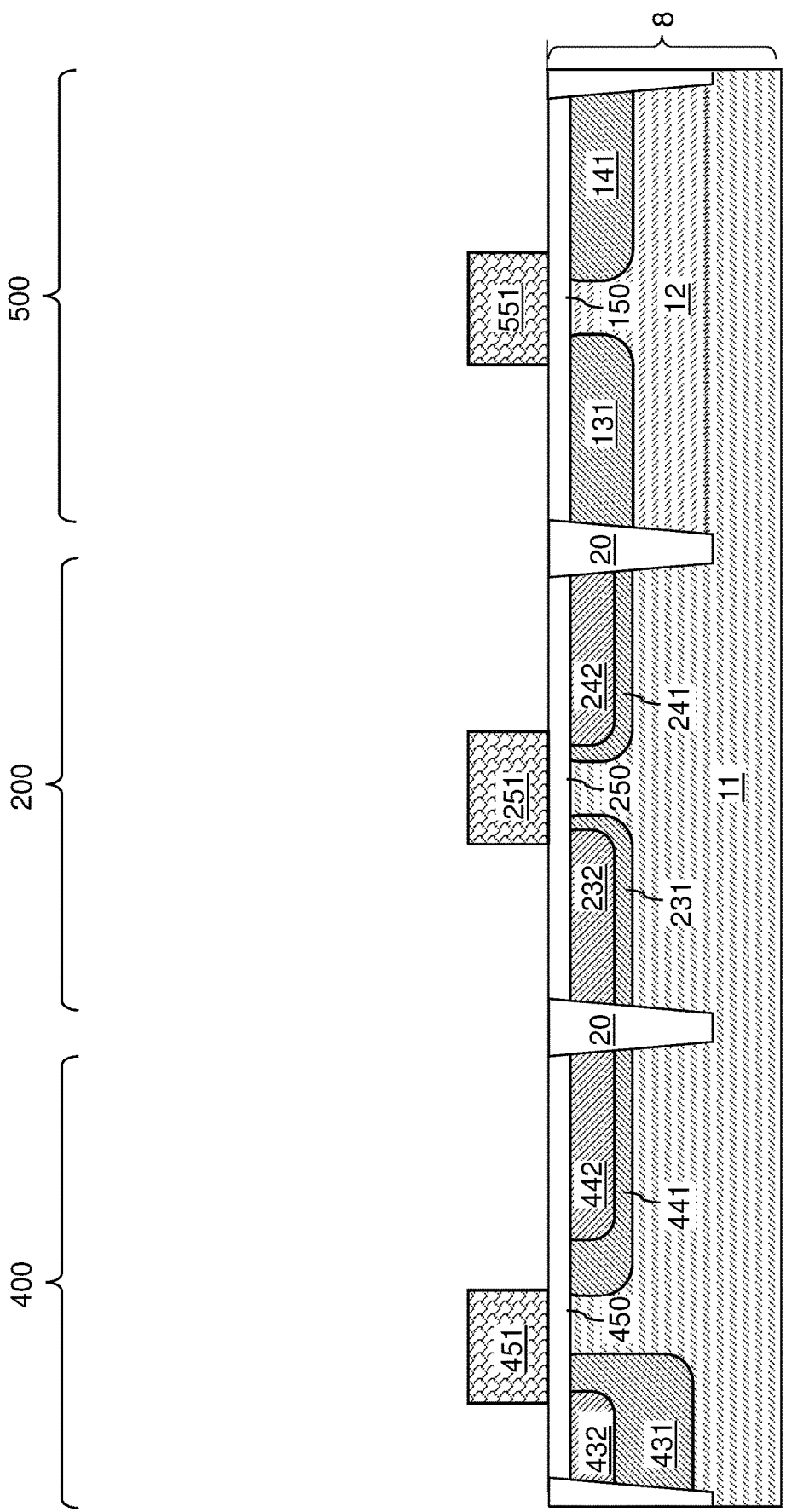
FIG. 5B is a vertical cross-sectional view of the second subset of the device regions in the exemplary structure of FIG. 5A.

Referring to FIGS. 5A and 5B, a semiconductor material, such as polysilicon, can be deposited over the semiconductor substrate 8 and the gate dielectrics (150, 250, 350, 450), and can be patterned into semiconductor gate electrodes (151, 251, 351, 451). The semiconductor gate electrodes (151, 251, 351, 451) may be suitably doped with dopants of the first conductivity type or with dopants of the second conductivity type by in-situ doping or by ex-situ doping (such as ion implantation after deposition of the semiconductor material). In one embodiment, the semiconductor gate electrodes (151, 251, 351, 451) may have the same conductivity type (e.g., may comprise in-situ doped n-type polysilicon). In another embodiment, ion implantation masks may be employed to provide different doping of the semiconductor gate electrodes (151, 251, 351, 451) between p-type field effect transistors and n-type field effect transistors. The semiconductor gate electrodes (151, 251, 351, 451) may comprise a first semiconductor gate electrode 151, a second semiconductor gate electrode 251, a third semiconductor gate electrode 351, a fourth semiconductor gate electrode 451, and a fifth semiconductor gate electrode 151 (which may have the same material composition as the first semiconductor gate electrode 151). The first semiconductor gate electrode 151 can be formed over the first gate dielectric 150, the second semiconductor gate electrode 251 can be formed over the second gate dielectric 250, the third semiconductor gate electrode 351 can be formed over the third gate dielectric 350, the fourth semiconductor gate electrode 451 can be formed over the fourth gate dielectric 450, and the fifth semiconductor gate electrode 151 can be formed over the fifth gate dielectric 150.

Figure 6A:
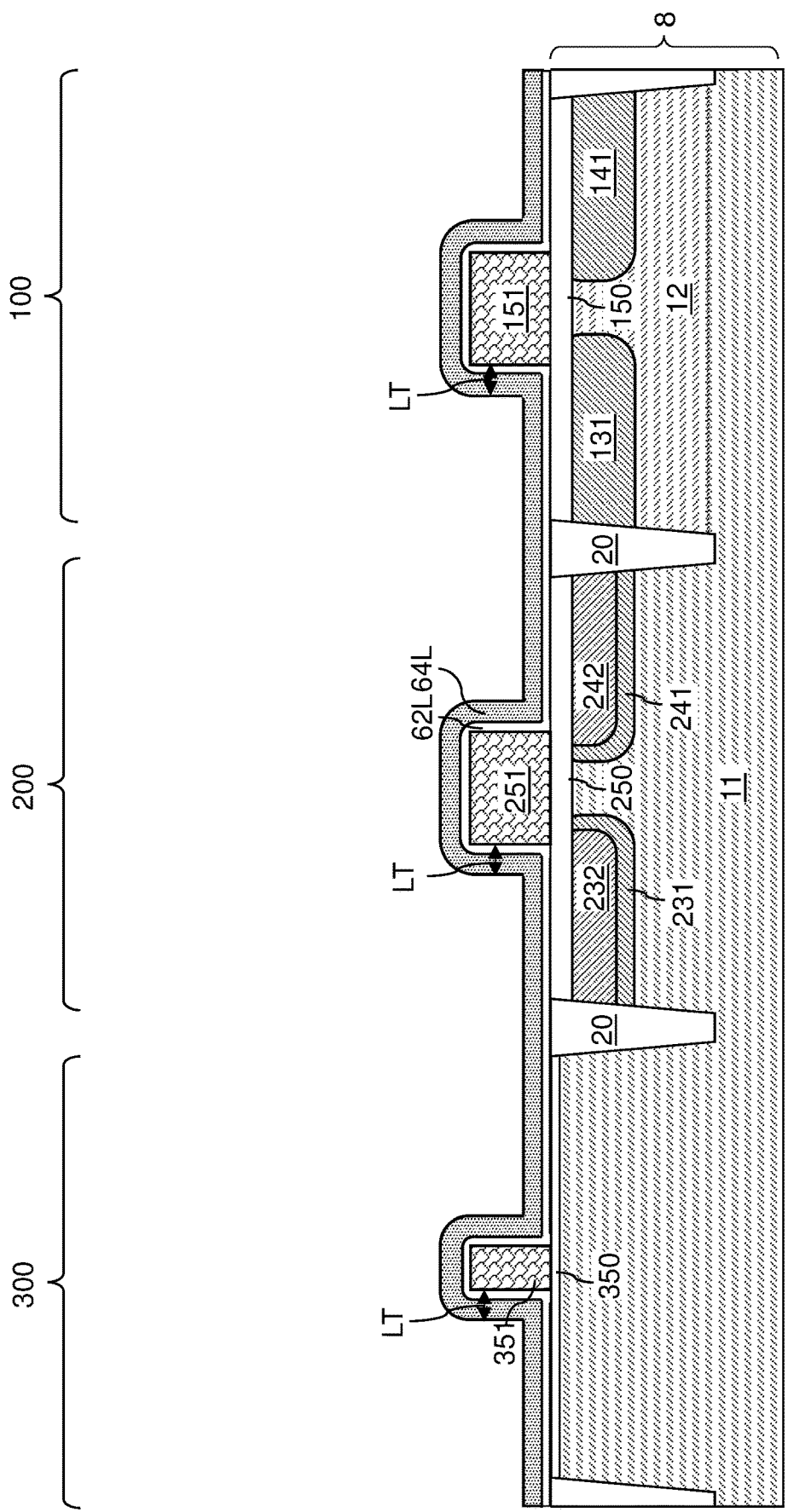
FIG. 6A is a vertical cross-sectional view of the first subset of the device regions in the exemplary structure after formation of at least one gate spacer layer according to an embodiment of the present disclosure.
Figure 6B:
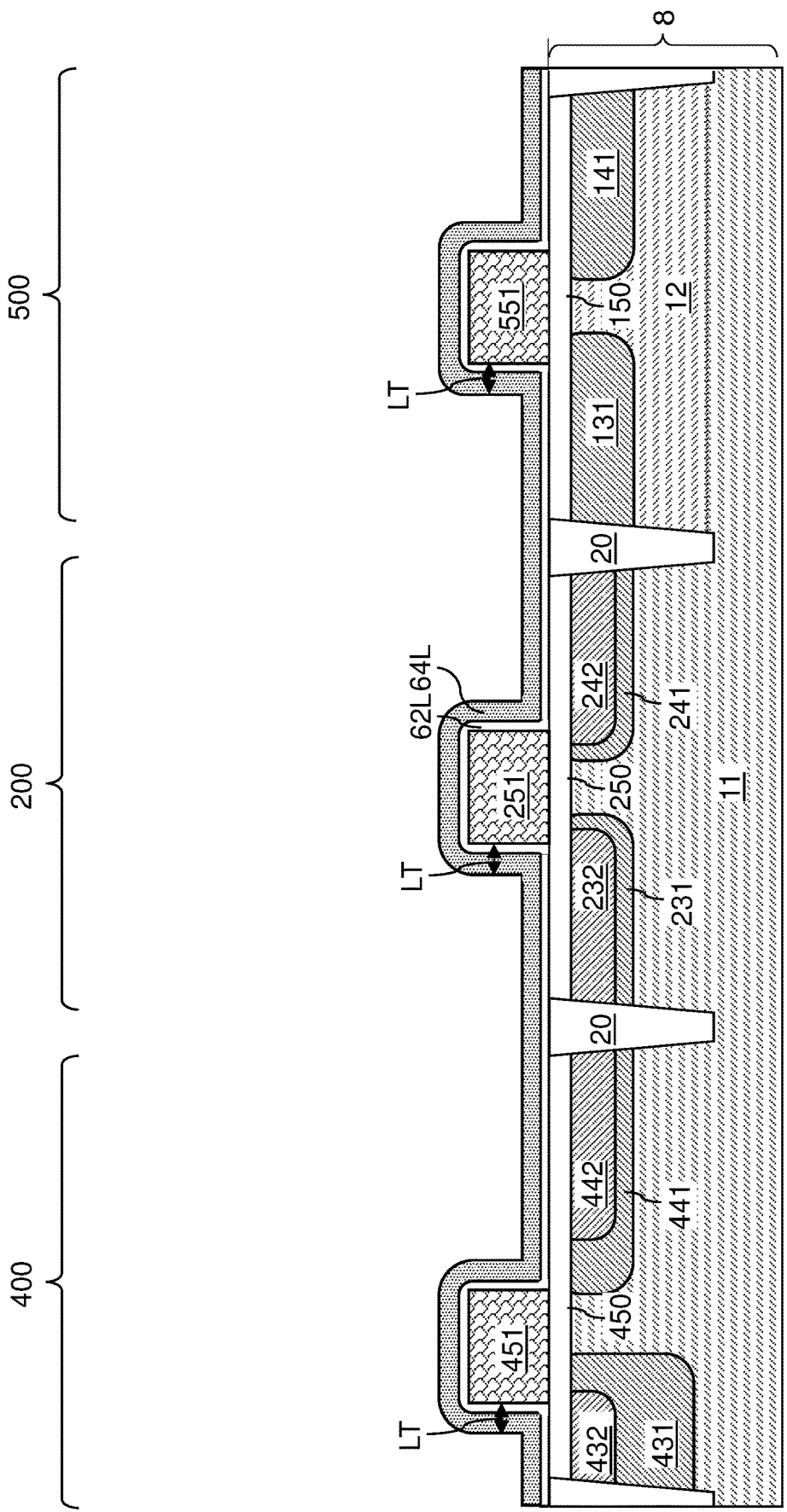
FIG. 6B is a vertical cross-sectional view of the second subset of the device regions in the exemplary structure of FIG. 6A.

Referring to FIGS. 6A and 6B, at least one gate spacer layer (62L, 64L) can be conformally deposited over the various semiconductor gate electrodes (151, 251, 351, 451). In one embodiment, the at least one gate spacer layer (62L, 64L) may comprise a dielectric layer stack that includes a silicon oxide layer 62L having a first thickness, and a silicon nitride layer 64L having a second thickness. Each of the silicon oxide layer 62L and the silicon nitride layer 64L can be deposited by a respective conformal deposition process, such as a low pressure chemical vapor deposition (LPCVD) process. The first thickness may be in a range from 5 nm to 50 nm, such as from 10 nm to 20 nm, and the second thickness may be in a range from 50 nm to 300 nm, such as from 100 nm to 200 nm, although lesser and greater thicknesses may also be employed. Each vertically-extending portion of the at least one gate spacer layer (62L, 64L) may have a lateral thickness LT. The lateral thickness LT may be the same as the sum of the first thickness and the second thickness. The lateral thickness LT may be in a range from 100 nm to 400 nm, although lesser and greater thicknesses may also be employed. Each horizontally-extending portion of the at least one gate spacer layer (62L, 64L) may have a same uniform thickness throughout, which may be the same as or less than the lateral thickness LT.

Figure 7A:
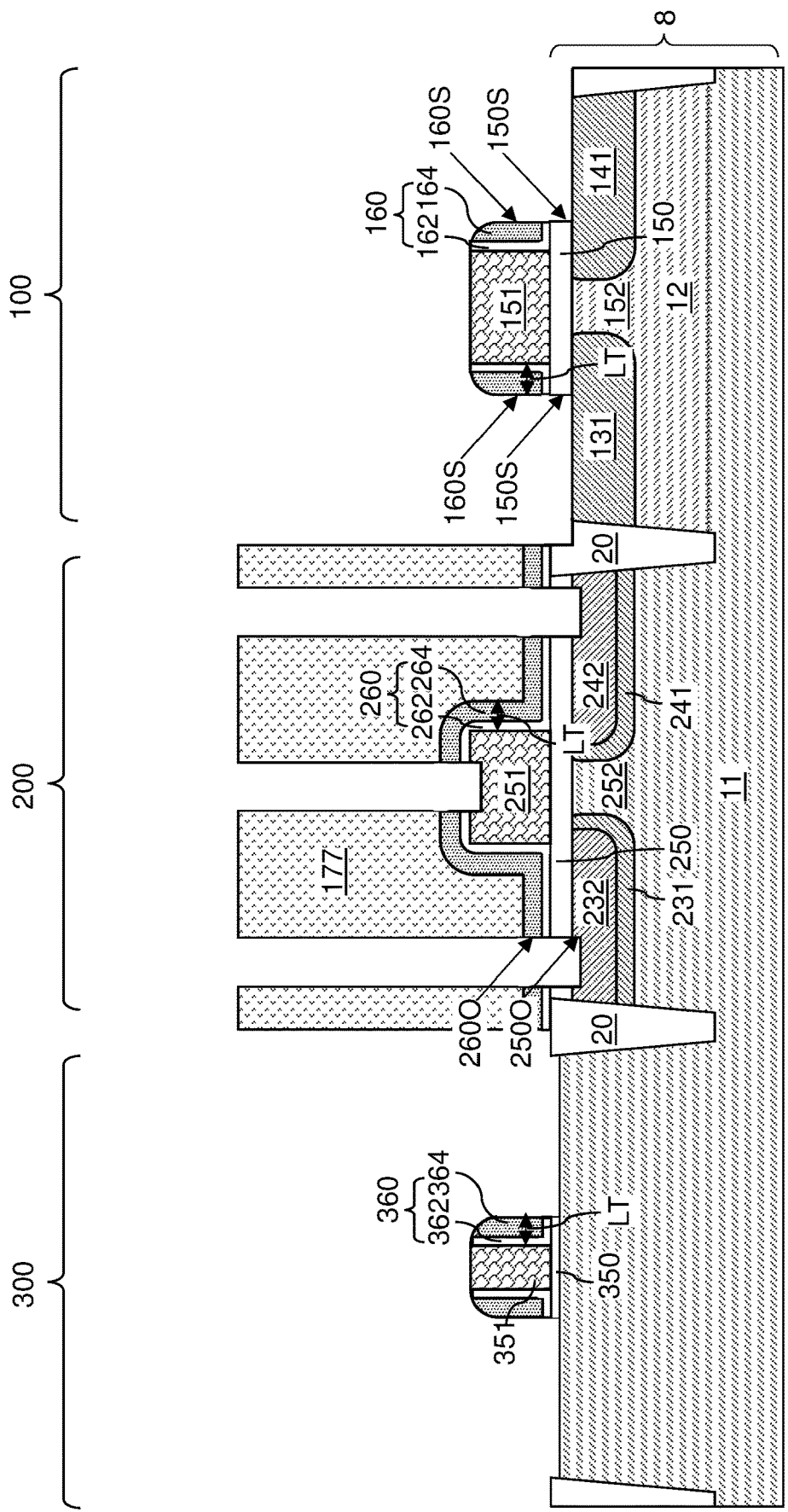
FIG. 7A is a vertical cross-sectional view of the first subset of the device regions in the exemplary structure after patterning the at least one gate spacer layer into gate spacers according to an embodiment of the present disclosure.
Figure 7B:
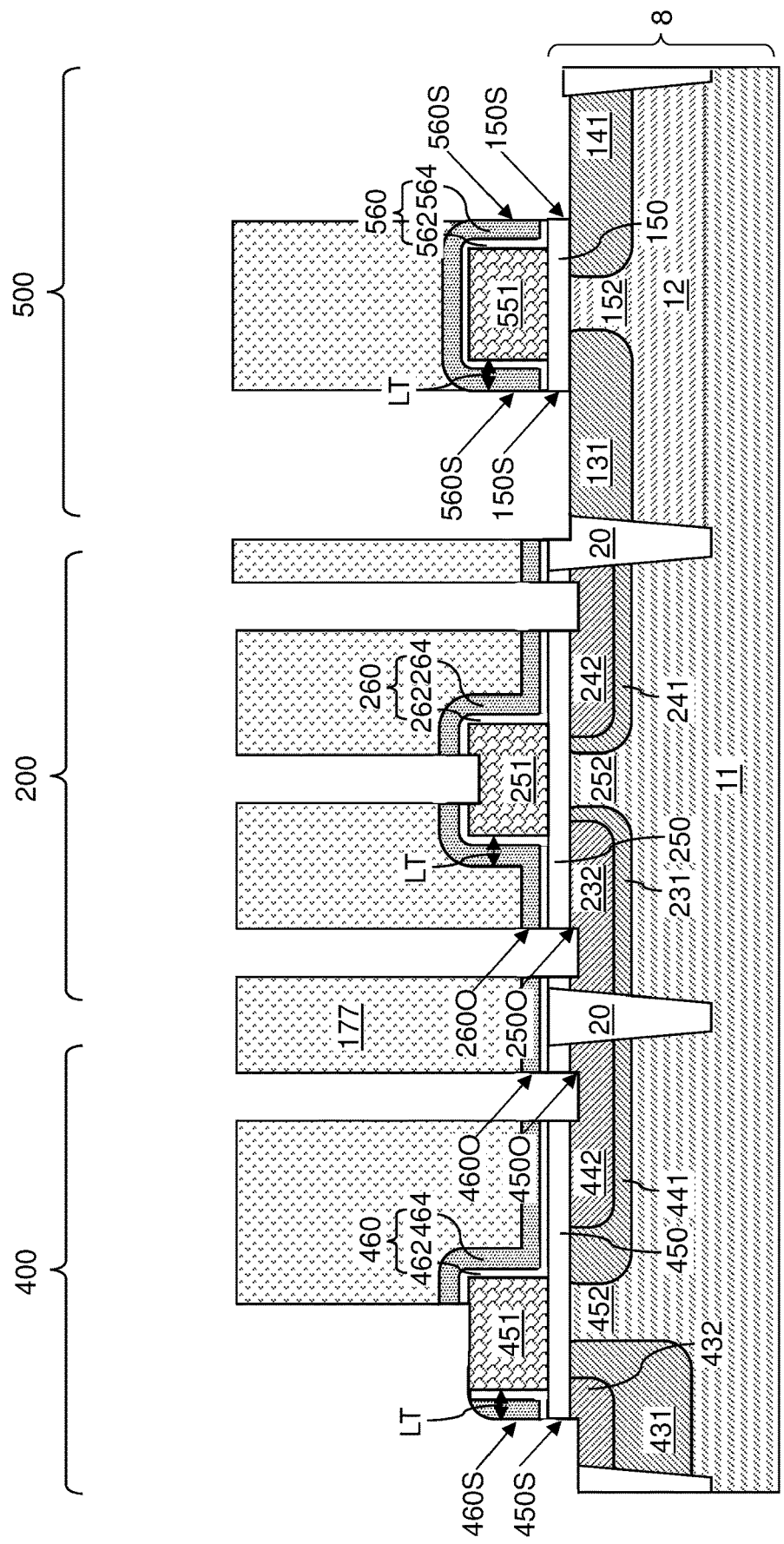
FIG. 7B is a vertical cross-sectional view of the second subset of the device regions in the exemplary structure of FIG. 7A.

Referring to FIGS. 7A and 7B, a photoresist layer 177 can be applied over the at least one gate spacer layer (62L, 64L), and can be lithographically patterned to cover first areas of the exemplary structure without covering second areas of the exemplary structure (which is the complement of the first areas). The portion of the photoresist layer 177 located in the second device region 200 may cover the entirety of the area of the second device region except a discrete area that overlies the second-conductivity-type source extension region 232, a discrete area that overlies the second-conductivity-type drain extension region 242, and a discrete area that overlies the second semiconductor gate electrode 251.

In one embodiment shown in FIG. 7A, the portions of the photoresist layer 177 located in the first device region 100 or in the third device region 300 may be entirely removed during patterning of the photoresist layer 177. In other words, the photoresist layer 177 may be entirely removed from the first device region 100 and from the third device region 300.

In one embodiment shown in FIG. 7B, the portion of the photoresist layer 177 located in the fifth device region 500 may be patterned such that the patterned photoresist layer 177 does not cover any horizontally-extending portion of the at least one gate spacer layer (62L, 64L) located outside an area enclosed by outer sidewalls of the at least one gate spacer layer (62L, 64L) (such as outer sidewalls of the silicon nitride layer 64L) that laterally surrounds the fifth semiconductor gate electrode 551 in the fifth device area. In this case, the portion of the photoresist layer 177 located in the fifth device region 500 may cover the entirety of the area of the fifth semiconductor gate electrode 551 in a plan view, such as a top-down view. Thus, all sidewalls of a patterned portion of the photoresist layer 177 may be located within a frame-shaped area located outside the inner sidewalls of vertically-extending portions of the at least one gate spacer layer (62L, 64L) and inside the outer sidewalls of the vertically-extending portions of the at least one gate spacer layer (62L, 64L) in a plan view such as a top-down view. The overlay tolerance for the positions of the sidewalls of the patterned portion of the photoresist layer 177 in the fifth device region 500 may be the same as the lateral thickness LT.

In one embodiment shown in FIG. 7B, the portion of the photoresist layer 177 located in the fourth device region 400 may be patterned to cover an entirety of a second-conductivity-type drain extension region 442 except a discrete smaller area therein, and to cover a portion of the fourth semiconductor gate electrode 451 that is proximal to the second-conductivity-type drain extension region 442 without covering a portion of the fourth semiconductor gate electrode 451 that is proximal to the second-conductivity-type source extension region 432. In this case, a laterally-straight edge of the photoresist layer 177 that is perpendicular to the channel direction (i.e., the lateral separation direction between the second-conductivity-type drain extension region 442 and the second-conductivity-type source extension region 432) can be formed above the fourth semiconductor gate electrode 451.

Unmasked portions of the at least one gate spacer layer (62L, 64L) can be anisotropically etched by performing at least one anisotropic etch process. For example, if the at least one gate spacer layer (62L, 64L) comprises a dielectric layer stack of a silicon oxide layer 62L and a silicon nitride layer 64L, a first anisotropic etch process may be performed to etch through unmasked portions of the silicon nitride layer 64L, and a second anisotropic etch process may be performed to etch through unmasked portions of the silicon oxide layer 62L. The at least one gate spacer layer (62L, 64L) is patterned into various gate sidewall spacers, which comprise a first gate spacer 160 formed in the first device region 100, a second gate spacer 260 formed in the second device region 200, a third gate spacer 360 formed in the third device region 300, a fourth gate spacer 460 formed in the fourth device region 400, and a fifth gate spacer 560 formed in the fifth device region 500.

The second anisotropic etch process may also remove each portion of the gate dielectrics (150, 250, 350, 450) that is not masked the photoresist layer 177. Thus, the areas of the gate dielectrics (150, 250, 350, 450) can be the same as the combination of the areas of the semiconductor gate electrodes (151, 252, 351, 451) and the areas of the gate spacers (160, 260, 360, 460, 560).

The first gate spacer 160 may comprise a dielectric layer stack of a first silicon oxide layer 162 and a first silicon nitride layer 164. The second gate spacer 260 may comprise a dielectric layer stack of a second silicon oxide layer 262 and a second silicon nitride layer 264. The third gate spacer 360 may comprise a dielectric layer stack of a third silicon oxide layer 362 and a third silicon nitride layer 364. The fourth gate spacer 460 may comprise a dielectric layer stack of a fourth silicon oxide layer 462 and a fourth silicon nitride layer 464. The fifth gate spacer 560 may comprise a dielectric layer stack of a fifth silicon oxide layer 562 and a fifth silicon nitride layer 564.

In one embodiment, a remaining portion of the first gate dielectric 150 (which may be located in a first device region 100 or in a fifth device region 500) comprises two first laterally-straight sidewalls 150S that laterally extend over and overlie first active-region extensions (131, 141), and are vertically coincident with two first laterally-straight outer sidewalls (160S, 560S) of a first gate spacer (160, 560). As used herein, a laterally-straight surface refers to a surface that is straight in a plan view, such as a top-down view. In one embodiment, laterally-straight bottom edges of the first laterally-straight outer sidewalls (160S, 560S) of the first gate spacer (160, 560) coincide with top edges of laterally-straight sidewall of the first gate spacer (160, 560).

In one embodiment, a remaining portion of the second gate dielectric 250 comprises two discrete gate-dielectric openings 250O that underlie discrete gate-spacer openings 260O in a second gate spacer 260 that is a second patterned portion of the at least one gate spacer layer, overlie the second active-region extensions (232, 242), and are located entirely within an area of an opening in the shallow trench isolation structures 20. A remaining portion of the second gate dielectric 250 laterally extends over and overlies the shallow trench isolation structures 20. In one embodiment, top edges of the pair of discrete gate-dielectric openings 250O in the second gate dielectric 250 coincide with bottom edges of the discrete gate-spacer openings 260O in the second gate spacer 260.

In one embodiment, a remaining portion of the third gate dielectric 350 comprises two laterally-straight sidewalls that laterally extend over and overlie an underlying portion of the first-conductivity-type semiconductor layer 11, and are vertically coincident with two laterally-straight outer sidewalls of a third gate spacer 360.

A remaining portion of the fourth gate dielectric 450 comprises a laterally-straight sidewall 450S that laterally extends over and overlies the low voltage one of the fourth active-region extensions (such as a fourth source extension region 432), and is vertically coincident with a laterally-straight outer sidewall 460S with the fourth gate spacer 460. This side of the field effect transistor may be the low voltage side. The remaining portion of the fourth gate dielectric 450 further comprises a discrete gate-dielectric opening 450O that underlies a discrete gate-spacer opening (which is referred to as a second gate-spacer opening 460O) in the fourth gate spacer 460, overlies a high voltage one of the fourth active-region extensions (such as a fourth drain extension region 442) and the shallow trench isolation structures 20. This side of the field effect transistor may be the high voltage side.

Each of the first device region 100 and in the fifth device region 500 may comprise first active-region extensions (such as the first active-region extensions (131, 141) or the fifth active-region extensions (531, 541)) laterally spaced from each other by a first semiconductor channel 152 (such as a surface portion of a second-conductivity-type well 12), a first gate dielectric 150 overlying the first semiconductor channel 152, a first semiconductor gate electrode 151 overlying the first gate dielectric 150, and a first gate spacer (160, 560) having first laterally-straight outer sidewalls (160S, 560S) that are spaced from the first semiconductor gate electrode 151 by a lateral thickness LT of the first gate spacer (160, 560), wherein the first laterally-straight outer sidewalls (160S, 560S) have first laterally-straight bottom edges that coincide with top edges of first laterally-straight sidewalls 150S of the first gate dielectric 150. In one embodiment, the first active-region extensions (such as the first active-region extensions (131, 141) or the fifth active-region extensions (531, 541)) are laterally spaced from each other by the first semiconductor channel 152 along a first channel direction; and the first laterally-straight outer sidewalls (160S, 560S)

laterally extend straight along a horizontal direction that is perpendicular to the first channel direction.

The second device region 200 may comprise second active-region extensions (232, 242) laterally spaced from each other by a second semiconductor channel 252 (such as a surface portion of the first-conductivity-type semiconductor layer 11), a second gate dielectric 250 overlying the second semiconductor channel 252 and the second active-region extensions (232, 242) and including a pair of discrete gate-dielectric openings 250O therethrough that overlie a respective one of the second active-region extensions (232, 242). A second gate spacer 260 comprises a contoured portion that overlies and laterally surrounds a second semiconductor gate electrode 251 and further comprises horizontally-extending portions that overlie the second active-region extensions (232, 242) and including a pair of discrete gate-spacer openings 260O therethrough that overlie the second active-region extensions (232, 242).

In one embodiment, the semiconductor structure further comprises shallow trench isolation structures 20 located in an upper portion of the semiconductor substrate 8 and comprising a first opening in the first device region (such as the first device region 100 or the fifth device region 500) and comprising a second opening in the second device region (such as the second device region 200), wherein the first opening laterally surrounds the first active-region extensions (such as the first active-region extensions (131, 141) or the fifth active-region extensions (531, 541)), and the second opening laterally surrounds the second active-region extensions (232, 242). In one embodiment, each of the pair of discrete gate-dielectric openings 250O is laterally offset from and does not have any areal overlap in a top-down view with the shallow trench isolation structures 20.

In one embodiment, each discrete gate-dielectric opening 250O of the pair of discrete gate-dielectric openings 250O has a respective top periphery that coincides with a bottom periphery a of respective discrete gate-spacer opening 260O of the pair of discrete gate-spacer openings 260O of the second gate spacer 260. In one embodiment, each of the second active-region extensions (232, 242) is laterally spaced from the second gate spacer 260 by a greater lateral spacing than the lateral thickness LT of the first gate spacer (160, 560).

The fourth device region 400 may comprise fourth active-region extensions (432, 442) laterally spaced from each other by a fourth semiconductor channel 452 (such as a surface portion of the first-conductivity-type semiconductor layer 11), a fourth gate dielectric 450 overlying the second semiconductor channel 452 and the fourth active-region extensions (432, 442), and a fourth semiconductor gate electrode 451 that overlies the fourth gate dielectric 450. The fourth gate dielectric 450 includes a second laterally-straight sidewall 450S that is spaced from the fourth semiconductor gate electrode 451 by the lateral thickness LT and further includes a discrete gate-dielectric opening 450O that overlies one of the fourth active-region extensions (such as the fourth drain extension region 442). In one embodiment, the fourth active-region extensions (432, 442)) are laterally spaced from each other by the second semiconductor channel 452 along a second channel direction; and the second laterally-straight sidewall 450S laterally extends straight along a horizontal direction that is perpendicular to the second channel region.

In one embodiment, the semiconductor structure comprises shallow trench isolation structures 20 comprising an additional opening (such as a fourth opening) in the fourth device region 400 that laterally surrounds the fourth active-region extensions (432, 442). In one embodiment, the discrete gate-dielectric opening 450O is laterally offset from, and does not have any areal overlap in a top-down view with, the shallow trench isolation structures 20.

In one embodiment, the semiconductor structure comprises a fourth gate spacer 460. The fourth gate spacer 460 comprises a contoured portion that overlies and laterally surrounds the fourth semiconductor gate electrode 451, and a horizontally-extending portion that overlies one of the second active-region extensions 442 and including a discrete gate-spacer opening 460O. In one embodiment, the fourth gate spacer 460 comprises a second laterally-straight outer sidewall 460S having a second laterally-straight bottom edge that coincides with a top edge of the second laterally-straight sidewall 450S of the fourth gate dielectric 450. In one embodiment, the discrete gate-dielectric opening 450O has a top periphery that coincides with a bottom periphery of the discrete gate-spacer opening 460O of the fourth gate spacer 460.

The photoresist layer 177 can be subsequently removed, for example, by ashing.

Figure 8A:
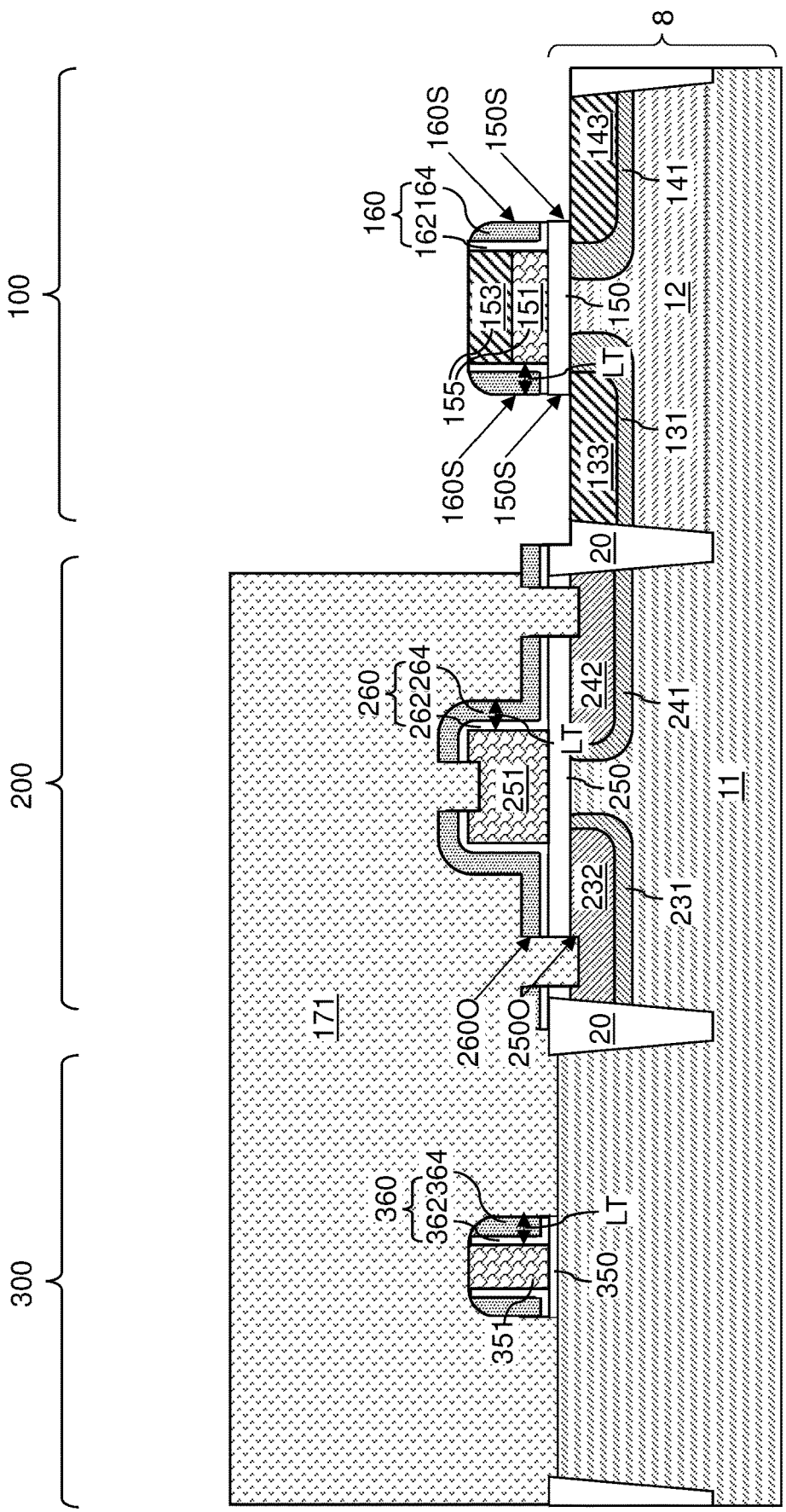
FIG. 8A is a vertical cross-sectional view of the first subset of the device regions in the exemplary structure after a first masked ion implantation process according to an embodiment of the present disclosure.
Figure 8B:
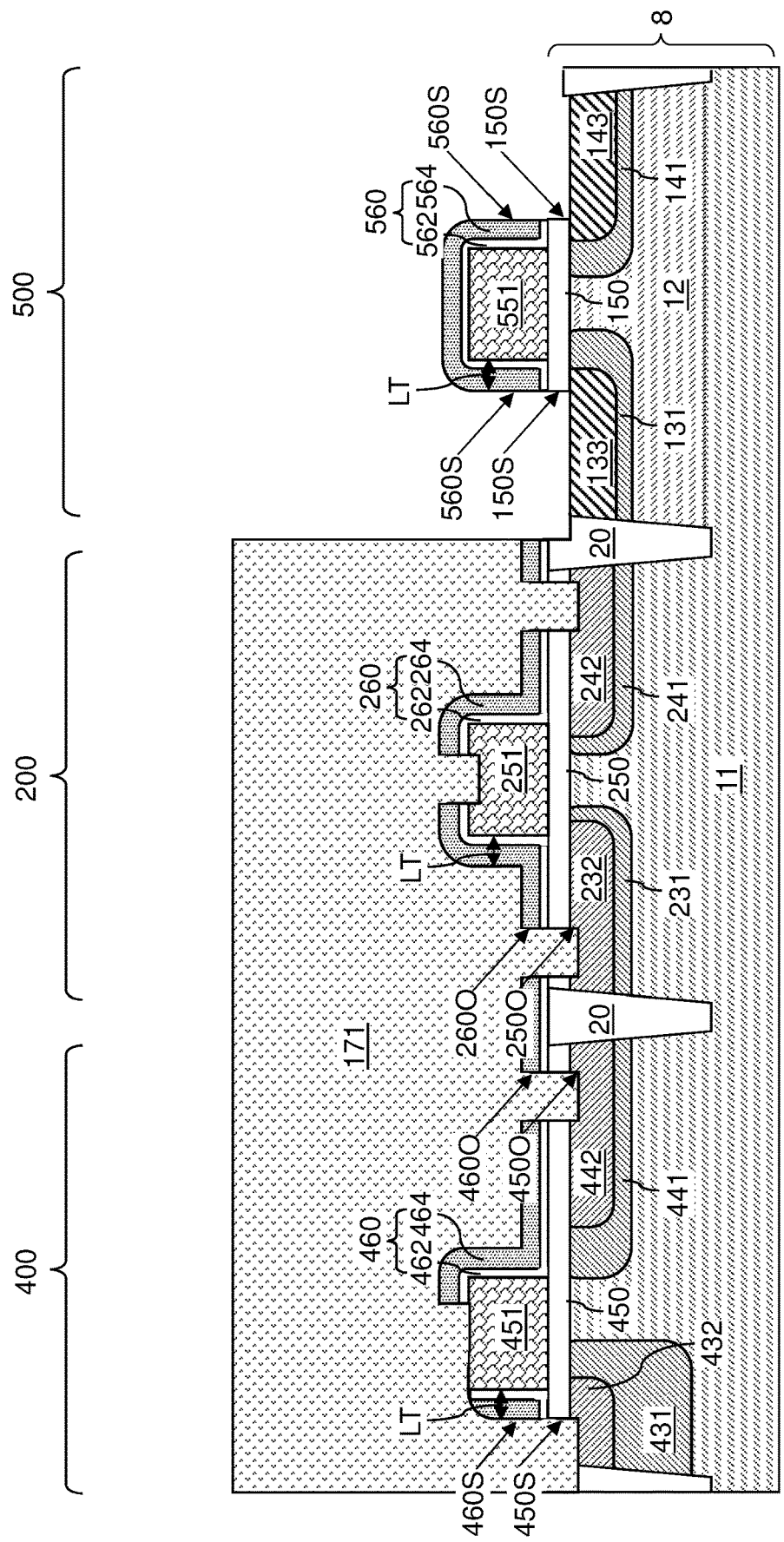
FIG. 8B is a vertical cross-sectional view of the second subset of the device regions in the exemplary structure of FIG. 8A.

Referring to FIGS. 8A and 8B, a first patterned photoresist layer 171 can be formed over the exemplary structure to cover device regions in which (e.g., n-type) second-conductivity-type field effect transistors are to be formed without covering device regions in which first-conductivity-type (e.g., p-type) field effect transistors are to be formed. The first-conductivity-type field effect transistors are transistors including active regions (i.e., a source region and a drain region) having a doping of the first conductivity type. The second-conductivity-type field effect transistors are transistors including active regions having a doping of the second conductivity type. In an illustrative example, the first patterned photoresist layer 171 covers the second device region 200, the third device region 300, and the fourth device region 400, and does not cover the first device region 100 or the fifth device region 500.

A first masked ion implantation process can be performed to implant dopants of the first conductivity type into portions of the semiconductor substrate 8 that are not masked by the first patterned photoresist layer 171 or by the combination of the gate spacers (such as the first gate spacer 160 and the fifth gate spacer 560), the semiconductor gate electrodes (such as the first semiconductor gate electrode 151 and the fifth semiconductor gate electrode 551), and the gate dielectrics (150, 250, 350, 450).

Heavily doped first active regions (133, 143) can be formed in the first active-region extensions (131, 141) by implanting dopants of a first conductivity type employing the first patterned photoresist layer 171 as a component of the first ion implantation mask structure. The dopants of the first conductivity type can be implanted into the first active-region extensions (131, 141) around the first gate spacer (160, 560) employing the first semiconductor gate electrode 151 and the first gate spacer (160, 560) as components of the first ion implantation mask structure.

In one embodiment, the first ion implantation mask structure comprises a first patterned photoresist layer 171 that covers all areas of the second active-region extensions (232, 242), the fourth active-region extensions (432, 442), the second gate dielectric 250, the fourth gate dielectric 450, the second semiconductor gate electrode 251, and the fourth semiconductor gate electrode 451, and does not cover any area of the first active-region extensions or the first semiconductor gate electrode 151.

The first active regions (133, 143) may comprise a first source region 133 and a first drain region 143. An upper portion of the first semiconductor gate electrode 151 may be converted into a first-conductivity-type doped semiconductor gate electrode 153. The combination of the remaining portion of the first semiconductor gate electrode 151 comprising the second-conductivity-type doped semiconductor material and the first-conductivity-type doped semiconductor gate electrode 153 constitutes a first gate electrode 155.

According to an aspect of the present disclosure, the implantation depth of the first masked ion implantation process may be less than the thickness of the fifth gate spacer 560, which is the lateral thickness LT of each of the gate spacers (160, 260, 360, 460, 560). In this case, the fifth semiconductor gate electrode 551 may not be implanted with dopants of the first conductivity type, which may be advantageously employed to control the work function of the fifth semiconductor gate electrode 551. The implantation depth of the first masked ion implantation process may be the same as the vertical thickness of the first active regions (133, 143), and may be in a range from 40 nm to 200 nm, such as from 60 nm to 150 nm, although lesser and greater implantation depths may also be employed. The first patterned photoresist layer 171 may be subsequently removed, for example, by ashing.

Figure 9A:
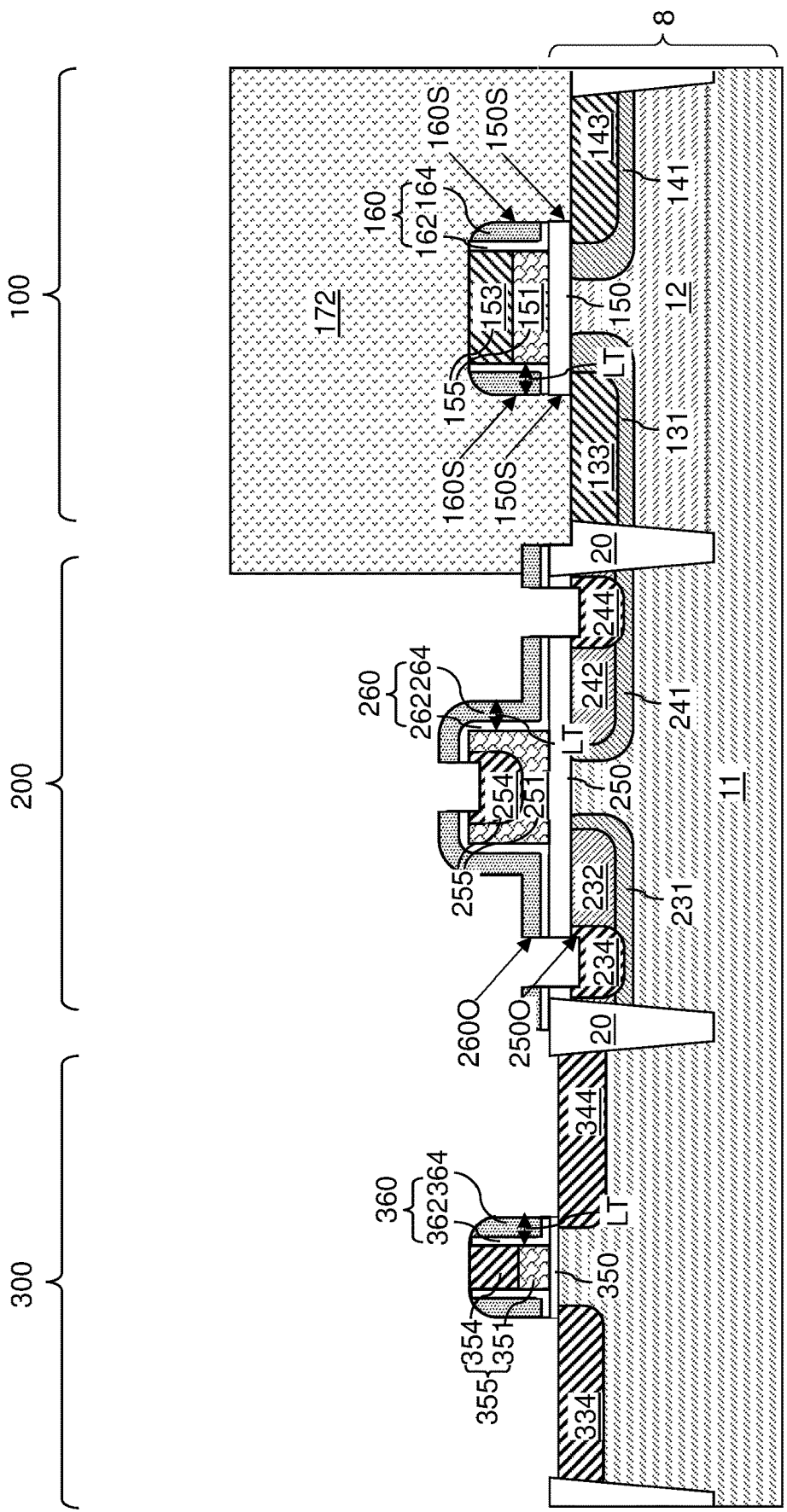
FIG. 9A is a vertical cross-sectional view of the first subset of the device regions in the exemplary structure after a second masked ion implantation process according to an embodiment of the present disclosure.
Figure 9B:
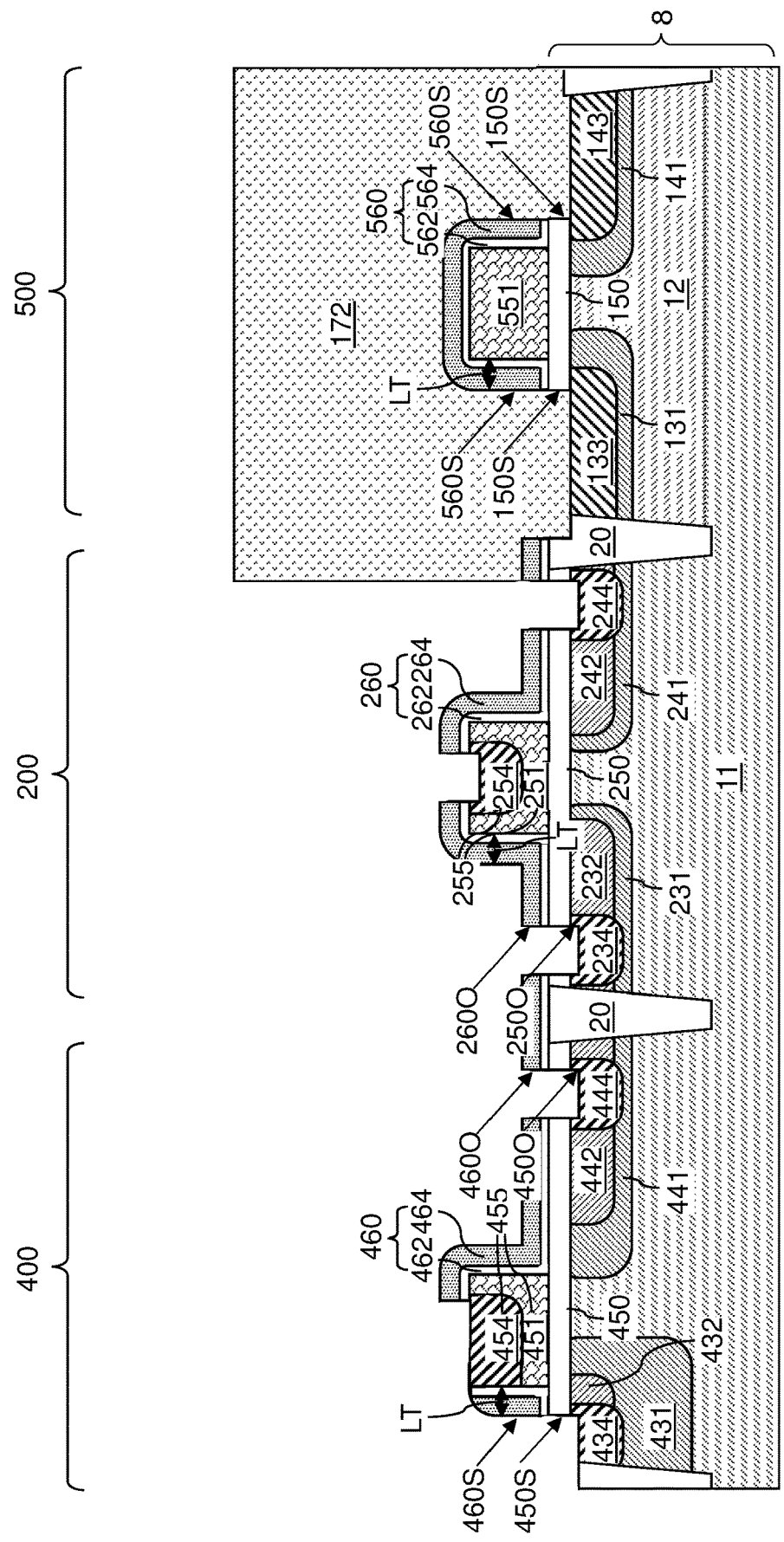
FIG. 9B is a vertical cross-sectional view of the second subset of the device regions in the exemplary structure of FIG. 9A.
Figure 10A:
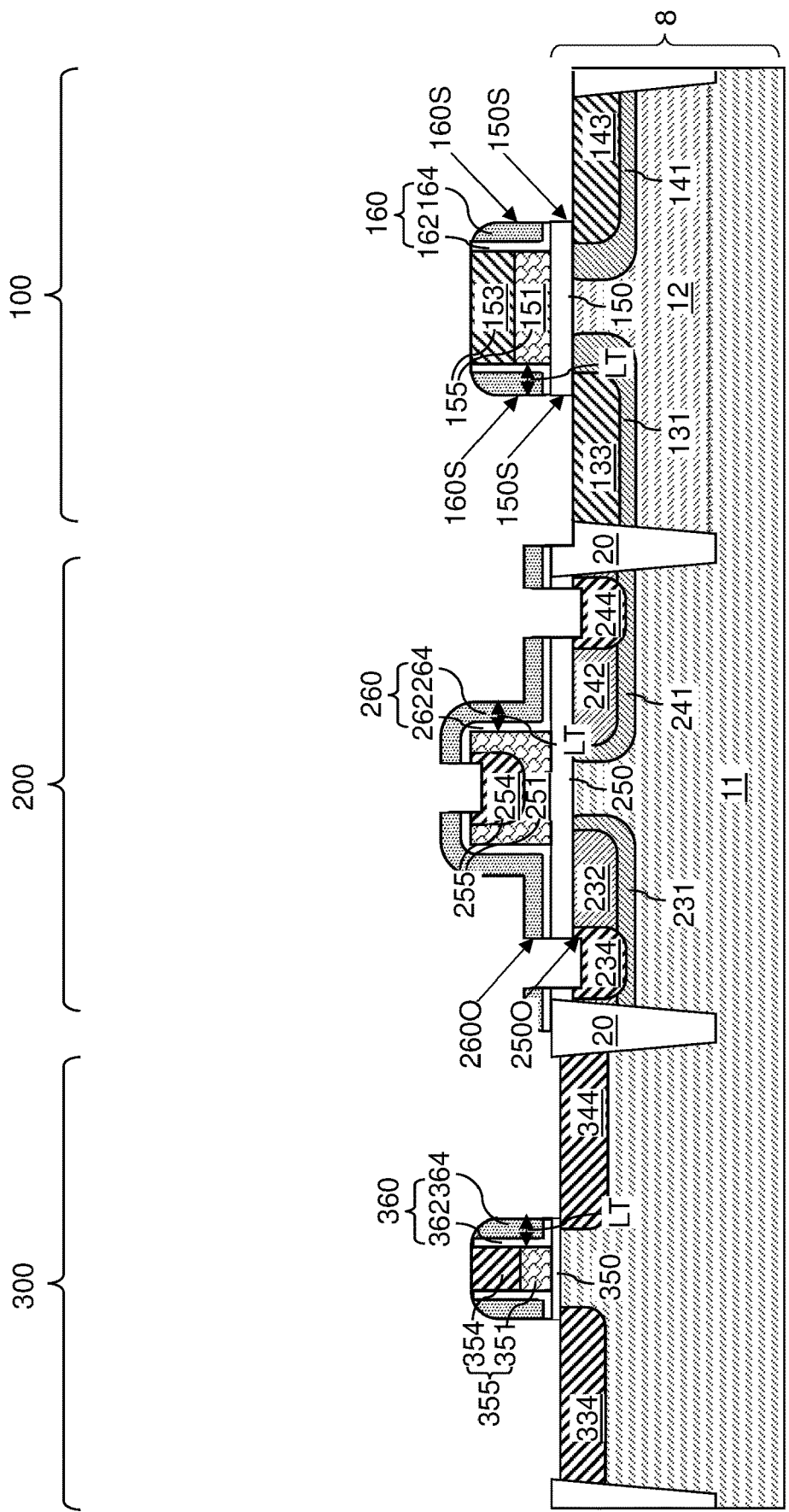
FIG. 10A is a vertical cross-sectional view of the first subset of the device regions in the exemplary structure after removal of a second ion implantation mask layer according to an embodiment of the present disclosure.
Figure 10B:
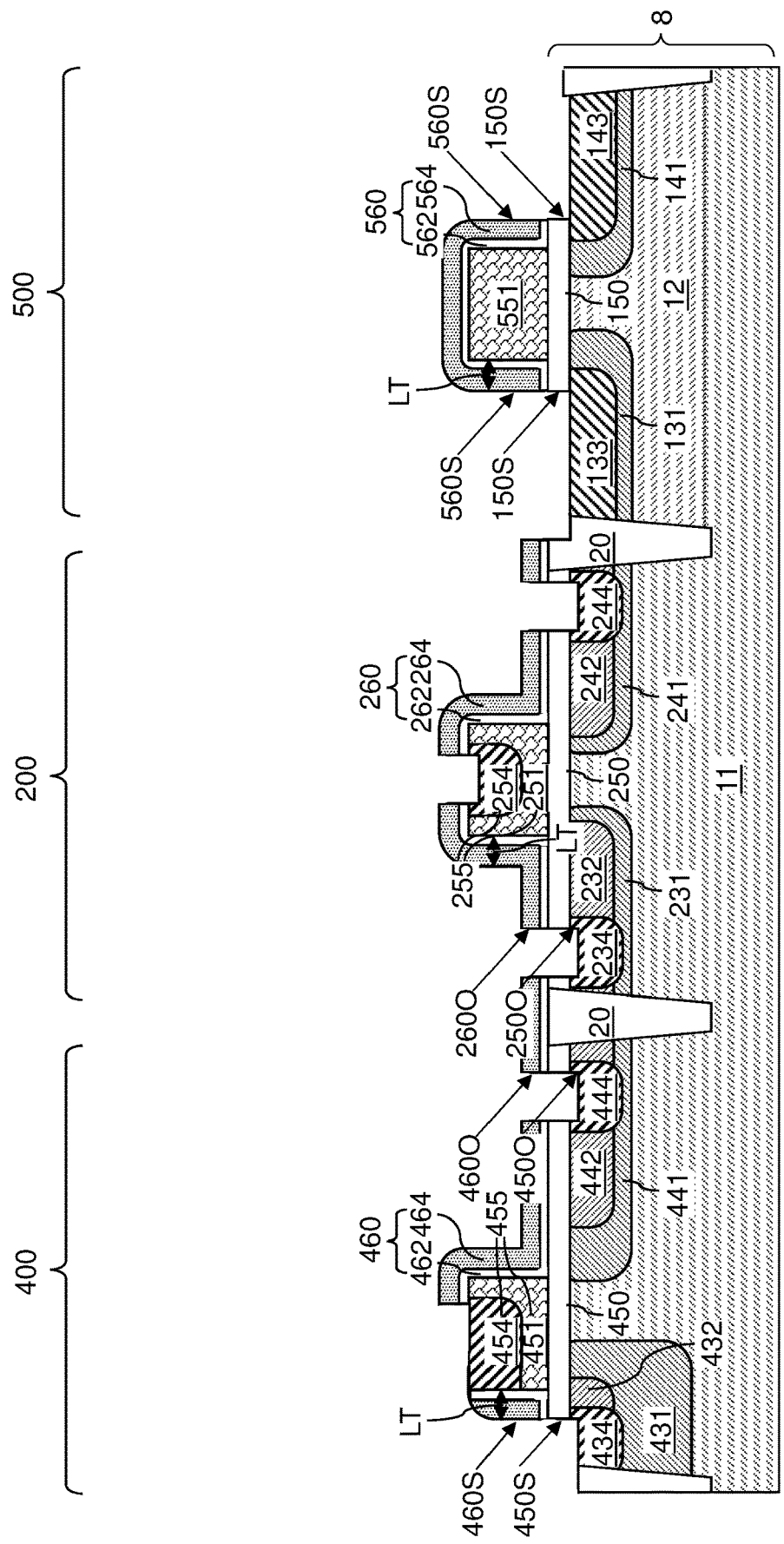
FIG. 10B is a vertical cross-sectional view of the second subset of the device regions in the exemplary structure of FIG. 10A.
Figure 10C:
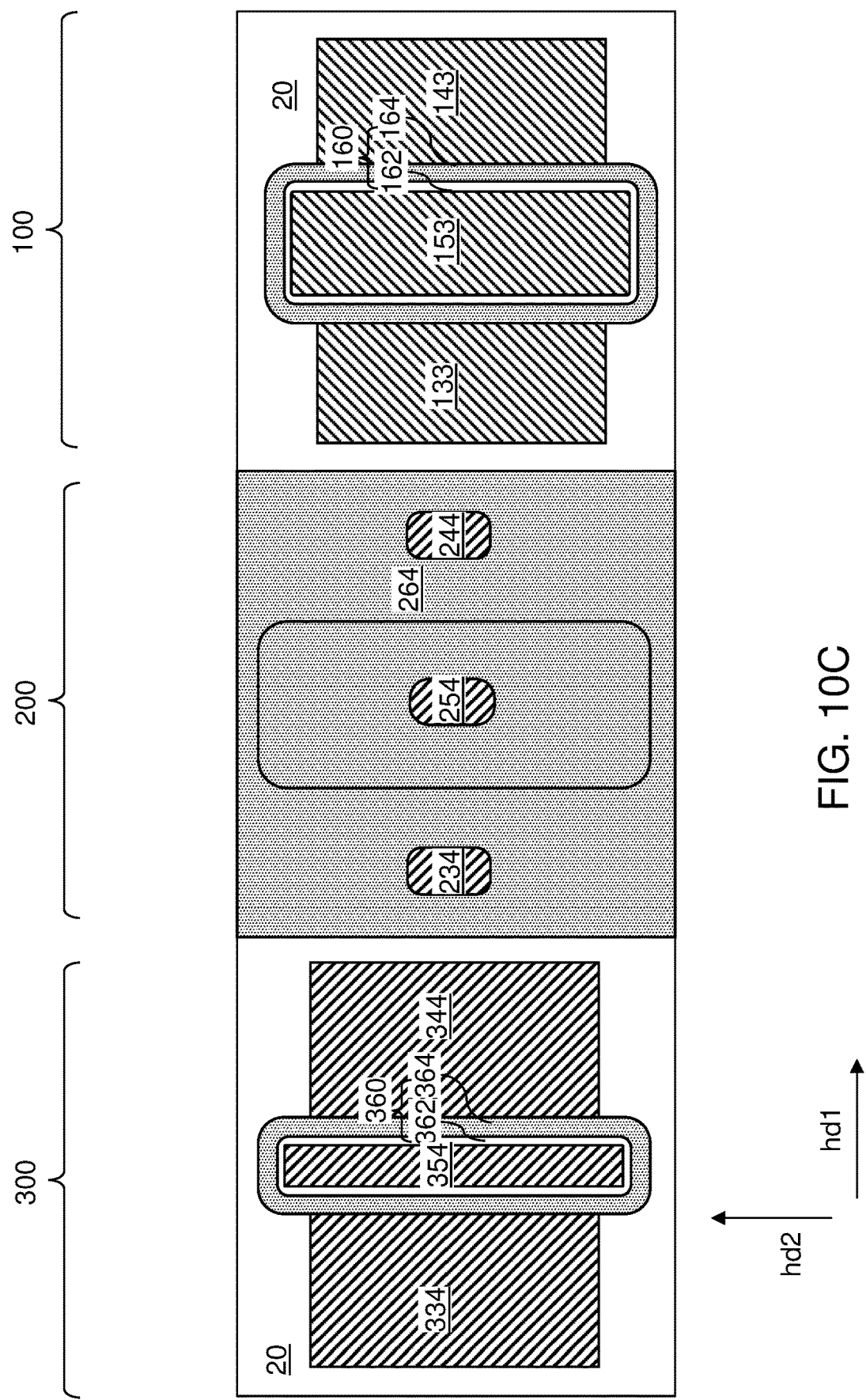
FIG. 10C is a top-down view of the first subset of the device regions in the exemplary structure of FIG. 10A.
Figure 10D:
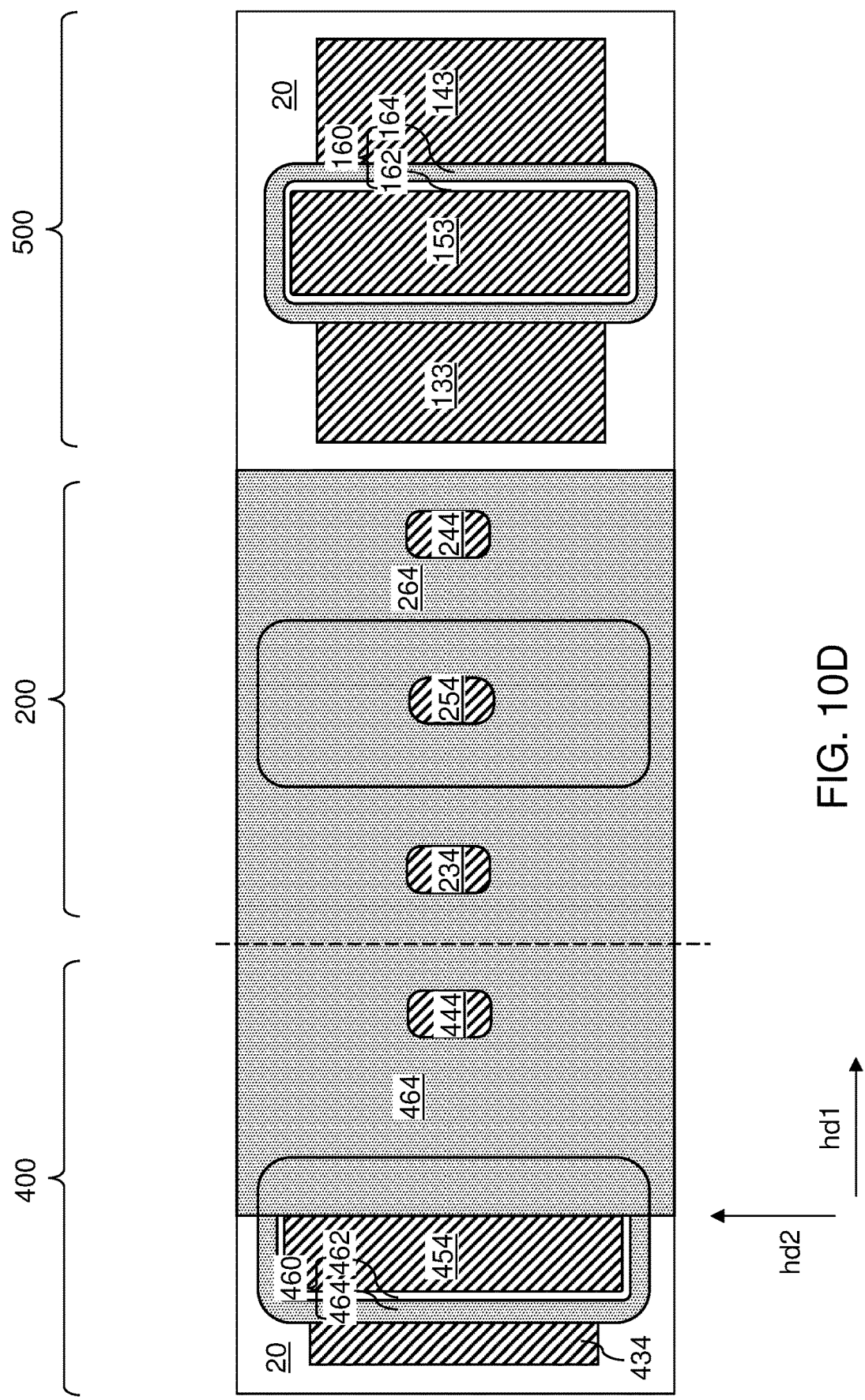
FIG. 10D is a top-down view of the second subset of the device regions of the exemplary structure of FIG. 10B.

Referring to FIGS. 9A and 9B, a second patterned photoresist layer 172 can be formed over the exemplary structure to cover device regions including first-conductivity-type field effect transistors without covering device regions in which second-conductivity-type field effect transistors are to be formed. In an illustrative example, the second patterned photoresist layer 172 covers the first device region 100 and the fifth device region 500, and does not cover the second device region 200, the third device region 300, or the fourth device region 400.

In one embodiment, the second patterned photoresist layer 172 covers an entirety of the first active-region extensions (132, 141), the first gate electrode 151 and the fifth gate electrode 551, and does not the second active-region extensions (232, 242, 432, 442).

A second masked ion implantation process can be performed to implant dopants of the second conductivity type into portions of the semiconductor substrate 8 that are not masked by the second patterned photoresist layer 172 or by the combination of the gate spacers (such as the second gate spacer 260, the third gate spacer 360, and the fourth gate spacer 460), the semiconductor gate electrodes (such as the second semiconductor gate electrode 251, the third semiconductor gate electrode 351, and the fourth semiconductor gate electrode 451), and the gate dielectrics (150, 250, 350, 450). Thus, the combination of the second patterned photoresist layer 172, the gate semiconductor gate electrodes (151, 251, 351, 451), the gate dielectrics (150, 250, 350, 450), and the gate spacers (160, 260, 360, 460, 560) can function as a second ion implantation mask structure for the second masked ion implantation process.

Heavily doped active regions (234, 244, 334, 344, 434, 444) can be formed by implanting dopants of the second conductivity type employing the second patterned photoresist layer 172 as a component of the second ion implantation mask structure, which is composite ion implantation mask structure including multiple components. Dopants of the second conductivity type can be implanted into the second active-region extensions (232, 242) through the pair of discrete gate-dielectric openings 250O to form a second source region 234 and a second drain region 244. Dopants of the second conductivity type can be implanted into a portion of the semiconductor substrate 8 in the third device region 300 to form a third source region 334 and a third drain region 344. Dopants of the second conductivity type can be implanted into an area within the fourth device region 400 between the second laterally-straight sidewall 450S and an edge of the shallow trench isolation structures 20 to form a fourth source region 434. Dopants of the second conductivity type can be implanted into the fourth drain extension region 442 through a discrete gate-dielectric opening 450O to form a fourth drain region 444.

An upper portion of the second semiconductor gate electrode 251 may be additionally doped with second-conductivity-type dopants to form a heavily second-conductivity-type doped semiconductor gate electrode 253. The combination of the remaining portion of the second semiconductor gate electrode 251 comprising a second-conductivity-type doped semiconductor material and the heavily second-conductivity-type doped semiconductor gate electrode 253 constitutes a second gate electrode 255.

An upper portion of the third semiconductor gate electrode 351 may be additionally doped with second-conductivity-type dopants to form a heavily second-conductivity-type doped semiconductor gate electrode 353. The combination of the remaining portion of the third semiconductor gate electrode 351 comprising a second-conductivity-type doped semiconductor material and the second-conductivity-type doped semiconductor gate electrode 353 constitutes a third gate electrode 355.

An upper portion of the fourth semiconductor gate electrode 451 may be additionally doped with second-conductivity-type dopants to form a heavily second-conductivity-type doped semiconductor gate electrode 453. The combination of the remaining portion of the fourth semiconductor gate electrode 451 comprising a second-conductivity-type doped semiconductor material and the second-conductivity-type doped semiconductor gate electrode 453 constitutes a fourth gate electrode 455.

The implantation depth of the second masked ion implantation process may be less than the sum of the thickness of each gate spacer (i.e., the lateral thickness LT of each of the gate spacers (160, 260, 360, 460, 560)) and the thickness of the thick gate dielectrics (such as the thickness of the first gate dielectric 150, the second gate dielectric 250, and the fourth gate dielectric 450). In this case, the lateral extent of each of the second active regions (234, 244) may be the sum of the lateral dimension of a discrete gate-dielectric opening 250O and twice the lateral straggle distance of the second masked ion implantation process. Likewise, the lateral extent of the fourth drain region 444 may be the sum of the lateral dimension of a discrete gate-dielectric opening 450O and twice the lateral straggle distance of the second masked ion implantation process. The implantation depth of the first masked ion implantation process may be the same as the vertical thickness of the second active regions (234, 244), and may be in a range from 40 nm to 300 nm, such as from 60 nm to 200 nm, although lesser and greater implantation depths may also be employed. The second patterned photoresist layer 172 may be subsequently removed, for example, by ashing.

Referring to FIGS. 10A-10D, the exemplary structure is illustrated after removal of the second patterned photoresist layer 172. While the channel direction for each of the field effect transistors is a first horizontal direction hd1, and all laterally-straight sidewalls of the gate spacers (160, 360, 460) that straddle and contact a respective underlying active region (133, 143, 334, 344, 434) laterally extend along a second horizontal direction hd2 that is perpendicular to the first horizontal direction hd1, embodiments are expressly contemplated herein in which the channel directions for the field effect transistors are independent from each other.

Figure 11A:
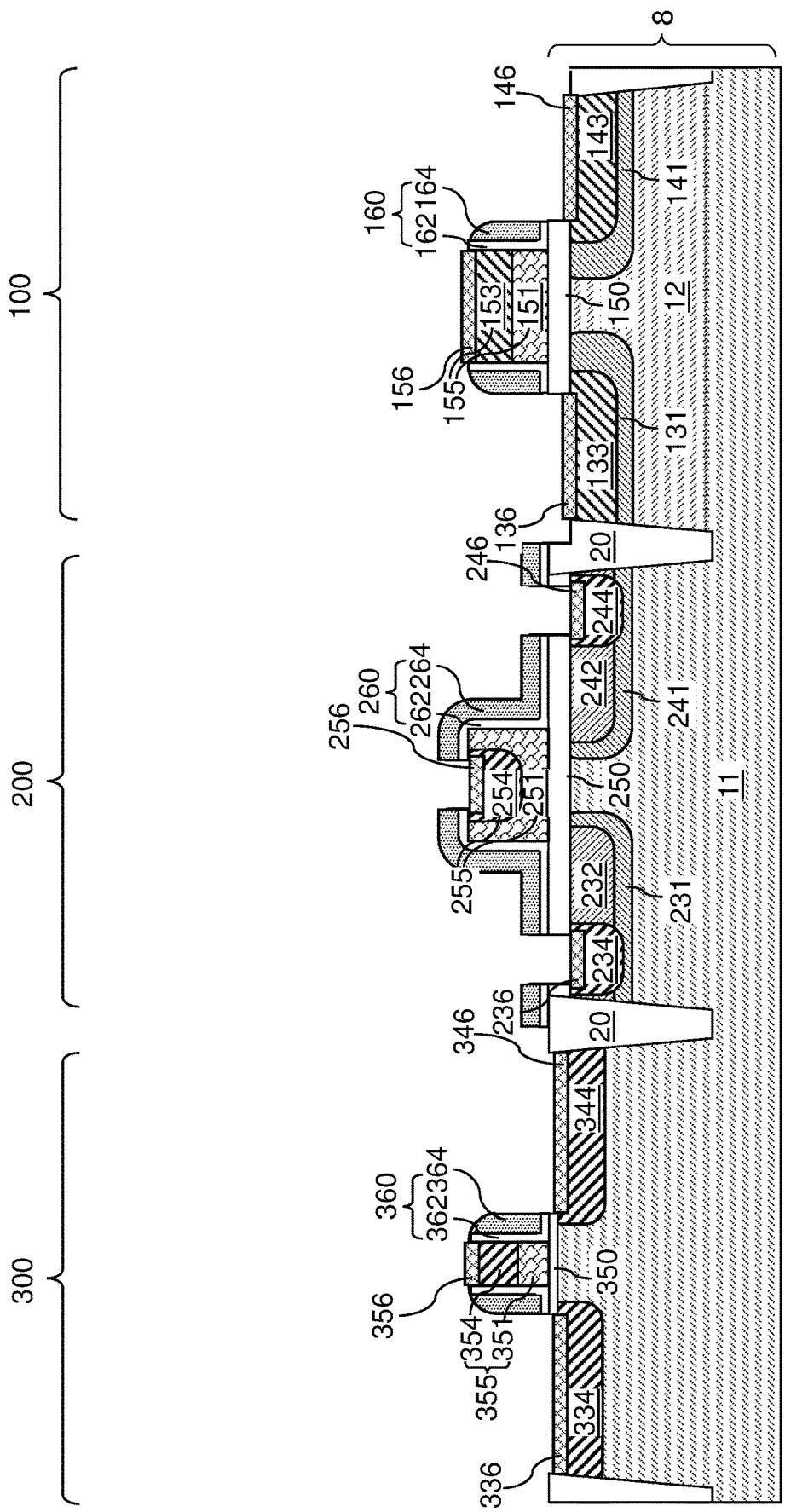
FIG. 11A is a vertical cross-sectional view of the first subset of the device regions in the exemplary structure after formation of metal-semiconductor alloy regions according to an embodiment of the present disclosure.
Figure 11B:
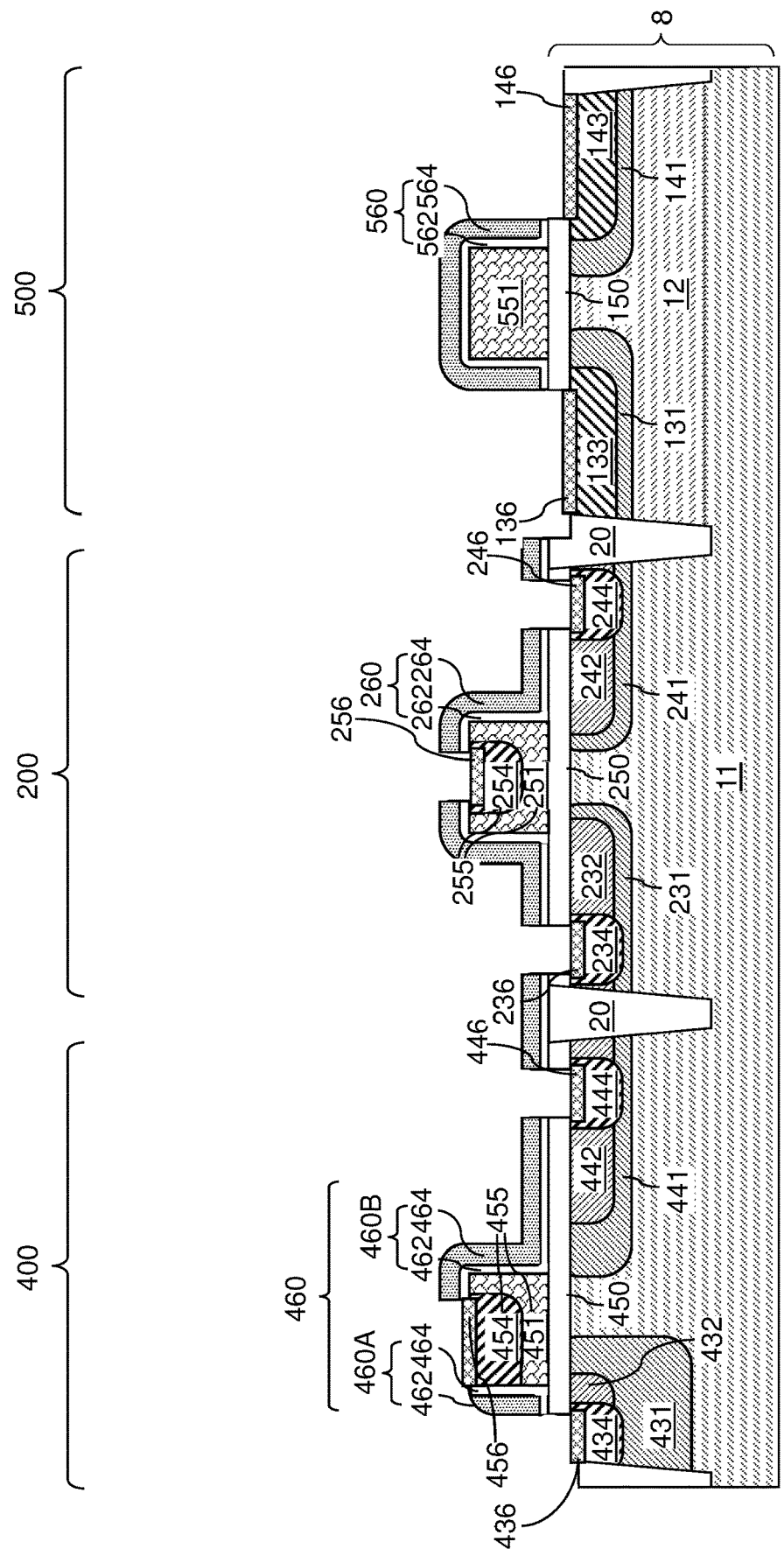
FIG. 11B is a vertical cross-sectional view of the second subset of the device regions in the exemplary structure of FIG. 11A.

Referring to FIGS. 11A and 11B, various metal-semiconductor alloy regions (136, 146, 236, 246, 336, 346, 436, 446, 156, 256, 356, 456) can be formed, for example, by depositing a metal or metal alloy layer including at least one metal that forms a metal-semiconductor alloy (such as a metal silicide) over the exemplary structure. The metal or metal alloy layer may comprise Ni, Pt, NiPt, Co, Ti, etc. An anneal process can be performed at an elevated temperature to induce formation of the metal-semiconductor alloy regions (136, 146, 236, 246, 336, 346, 436, 446, 156, 256, 356, 456). The various metal-semiconductor alloy regions (136, 146, 236, 246, 336, 346, 436, 446, 156, 256, 356, 456) may comprise source-side metal-semiconductor alloy regions (136, 236, 336, 436), drain-side metal-semiconductor alloy regions (146, 246, 346, 446), and gate metal-semiconductor alloy regions (156, 256, 356, 456). The formation of the gate metal-semiconductor alloy region on the fifth gate electrode 551 which is covered by the spacer 560 may be omitted. Unreacted portions of the metal layer can be removed by performing a selective etch process that etches the metal in the remaining portions of the metal layer selective to the metal-semiconductor alloy material in the metal-semiconductor alloy regions (136, 146, 236, 246, 336, 346, 436, 446, 156, 256, 356, 456). In one embodiment, the metal-semiconductor alloy regions (136, 146, 236, 246, 336, 346, 436, 446, 156, 256, 356, 456) comprise and/or consist essentially of a metal silicide material, such as nickel silicide, platinum silicide, nickel platinum silicide, cobalt silicide, titanium silicide, etc.

A first subset of the source-side metal-semiconductor alloy regions (136, 236, 336, 436) and the drain-side metal-semiconductor alloy regions (146, 246, 346, 446) may be in direct contact with the shallow trench isolation structures 20, and a second subset of the source-side metal-semiconductor alloy regions (136, 236, 336, 436) and the drain-side metal-semiconductor alloy regions (146, 246, 346, 446) may be laterally spaced from the shallow trench isolation structures 20. For example, the first source-side metal-semiconductor alloy regions 136, the first drain-side metal-semiconductor alloy regions 146, the third source-side metal-semiconductor alloy region 336, the third drain-side metal-semiconductor alloy region 346, and the fourth source-side metal-semiconductor alloy region 436 may directly contact the shallow trench isolation structures 20. The second source-side metal-semiconductor alloy region 236, the second drain-side metal-semiconductor alloy region 246, and the fourth drain-side metal-semiconductor alloy region 446 may be laterally spaced from the shallow trench isolation structures 20.

Figure 12A:
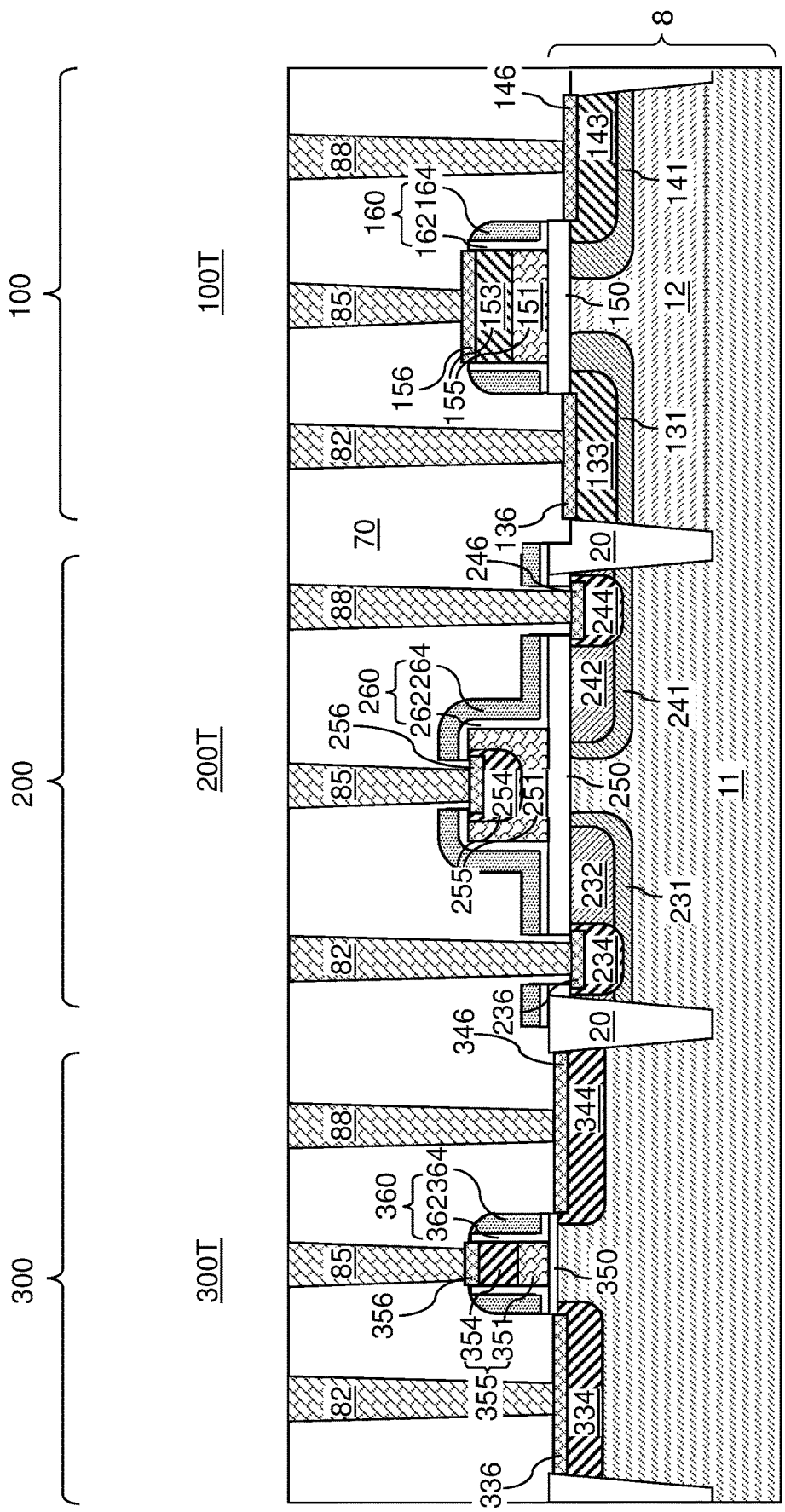
FIG. 12A is a vertical cross-sectional view of the first subset of the device regions in the exemplary structure after formation of a planarization dielectric layer according to an embodiment of the present disclosure.
Figure 12B:
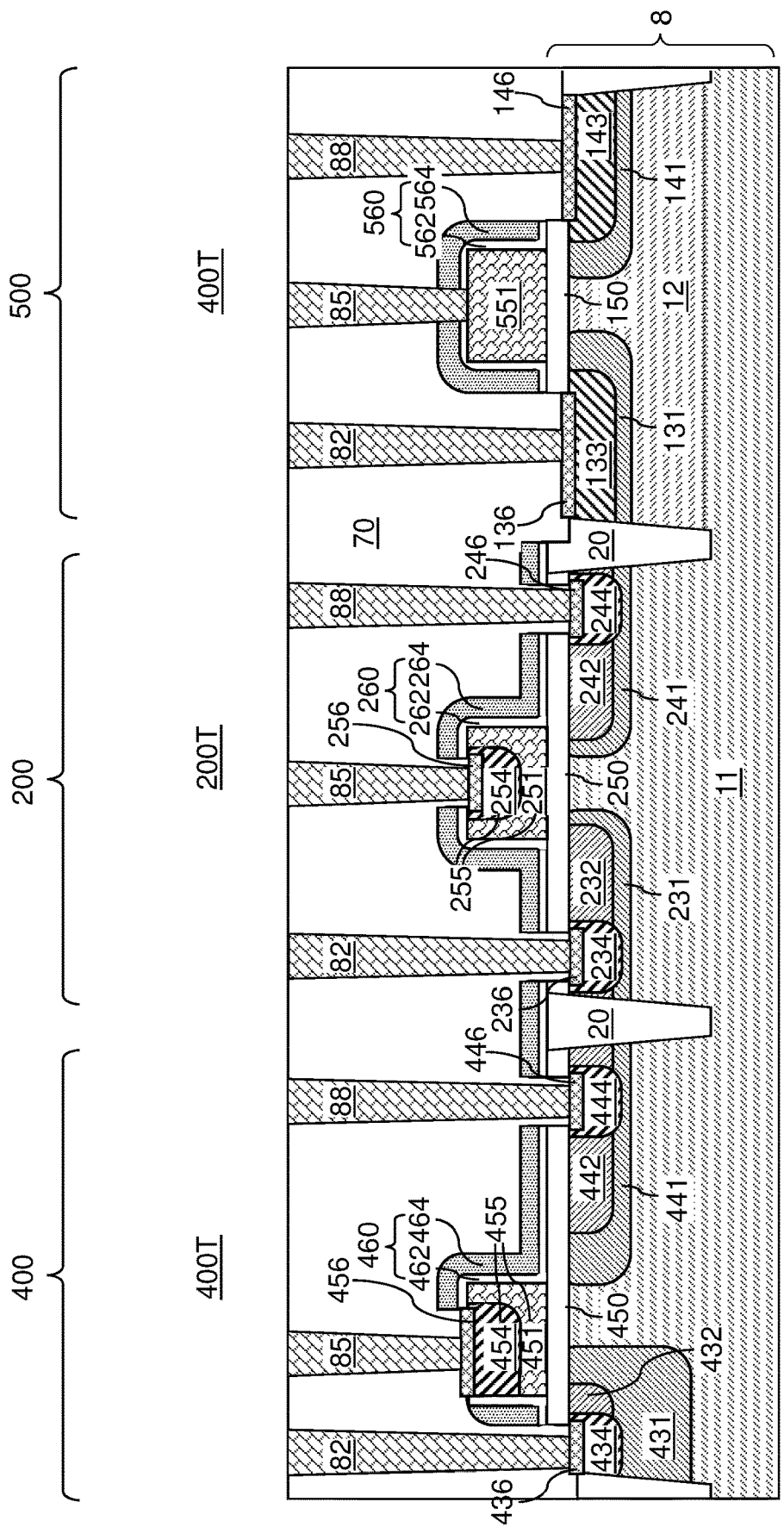
FIG. 12B is a vertical cross-sectional view of the second subset of the device regions in the exemplary structure of FIG. 12A.

Referring to FIGS. 12A and 12B, a planarization dielectric layer 70 can be deposited over the gate spacers (160, 260 360, 460, 560), and can be optionally planarized to form a horizontal top surface. Contact via cavities can be formed through the planarization dielectric layer 70 to a top surface of a respective one of the metal-semiconductor alloy regions (136, 146, 236, 246, 336, 346, 436, 446, 156, 256, 356, 456). Further, an additional contact via cavity can be formed through the planarization dielectric layer 70 and through a horizontally-extending portion of the fifth gate spacer 560 to expose a top surface of the fifth gate electrode 551. At least one electrically conductive material (such as a combination of a metallic nitride liner material and a metal fill material) can be deposited in the contact via cavities. Excess portions of the at least one electrically conductive material can be removed from above the horizontal plane including the top surface of the planarization dielectric layer 70. Each remaining portion of the at least one electrically conductive that fills a respective one of the contact via cavities constitutes a contact via structure. The contact via structures comprise active-region contact via structures (82, 88) and gate contact via structures 85. The active-region contact via structures (82, 88) comprise source-side contact via structures 82 that contact a respective one of the source-side metal-semiconductor alloy regions (136, 236, 336, 436) and drain-side contact via structures 88 that contact a respective one of the drain-side metal-semiconductor alloy regions (146, 246, 346, 446). The gate contact via structures 85 may contact a gate metal-semiconductor alloy region (156, 256, 356, 456) or may directly contact a semiconductor gate electrode, such as the fifth semiconductor gate electrode 551.

A high voltage p-type field effect transistor 100T is formed in the first device region 100. Another high voltage p-type field effect transistor 500T is formed in the fifth device region 500. A high voltage n-type field effect transistor 200T is formed in the second device region 200. The transistors 100T, 200T and 500T may be used as word line switching transistors a driver circuit of a memory device. A low voltage n-type field effect transistor 300T is formed in the third device region. An asymmetric low to high voltage n-type field effect transistor 400T is formed in the fourth device region 400. The transistor 400T may be used as a bit line hook up transistor in a driver circuit of a memory device.

In one embodiment, each of the second active-region contact via structures (82, 88) in the second device region 200 may vertically extend through a respective discrete gate-dielectric opening 250O of a pair of discrete gate-dielectric openings 250O, and may vertically extend through a respective discrete gate-spacer opening 260O of a pair of discrete gate-spacer openings 260O. In one embodiment, each of the second active-region contact via structures (82, 88) may be laterally spaced from the respective discrete gate-dielectric opening 250O, and may be laterally spaced from the respective discrete gate-spacer opening 260O In one embodiment, the fourth drain-side contact via structure 88 in the fourth device region 400 may vertically extends through a discrete gate-dielectric opening 450O, and may vertically extend through a discrete gate-spacer opening 460O. In one embodiment, the fourth drain-side contact via structure 88 in the fourth device region 400 may be laterally spaced from the discrete gate-dielectric opening 450O, and may be laterally spaced from the discrete gate-spacer opening 460O.

Figure 13A:
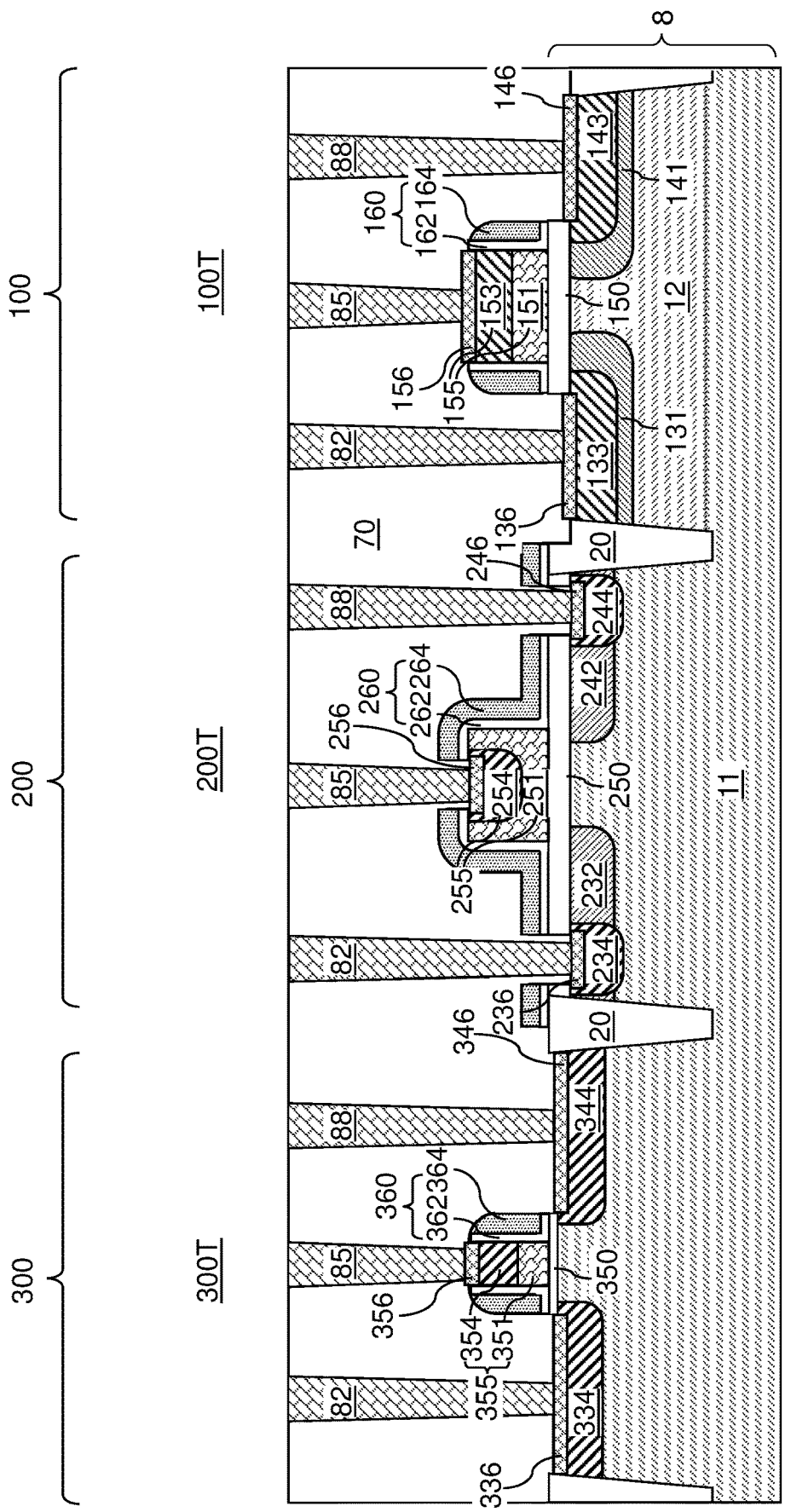
FIG. 13A is a vertical cross-sectional view of the first subset of the device regions in an alternative configuration of the exemplary structure according to an embodiment of the present disclosure.
Figure 13B:
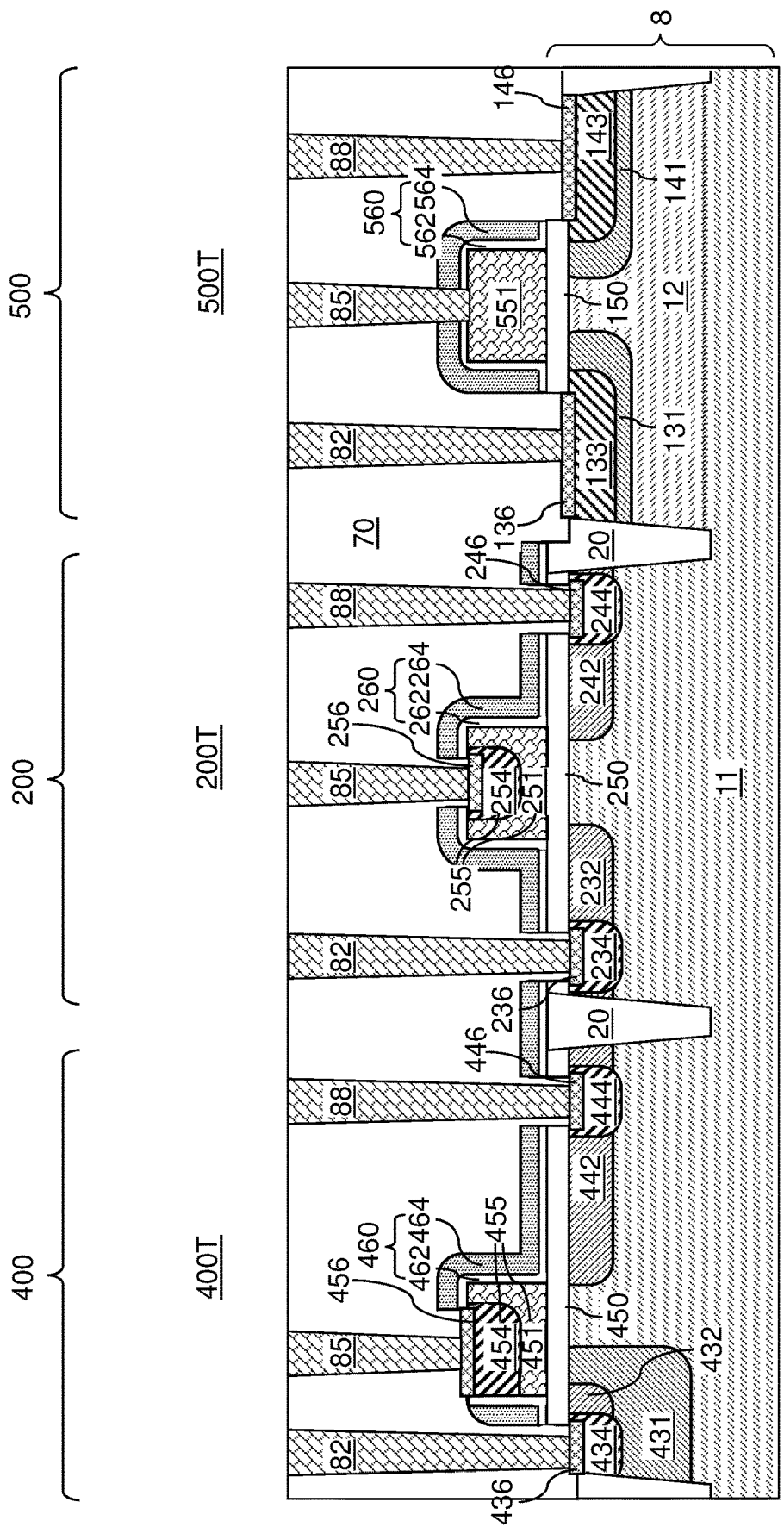
FIG. 13B is a vertical cross-sectional view a second subset of the device regions in the alterative configuration of the exemplary structure.

Referring to FIGS. 13A and 13B, an alternative configuration of the exemplary structure may be derived from the exemplary structure of FIGS. 12A and 12B by omitting formation of a source-side first-conductivity-type well 231 and a drain-side first-conductivity-type well 241 (e.g., the halo regions) in the second device region 200.

Referring to all embodiments of the present disclosure, a semiconductor structure comprises a first field effect transistor (100T, 500T) located over a substrate 8 in a first device region (such as the first device region 100 or the fifth device region 500) and comprising first active regions (133, 143) laterally spaced from each other by a first semiconductor channel 152, a first gate dielectric 150 overlying the first semiconductor channel 152, a first gate electrode (155 or 151) overlying the first gate dielectric 150, and a first gate spacer (160, 560) having first laterally-straight outer sidewalls (160S, 560S) that have first laterally-straight bottom edges that coincide with top edges of first laterally-straight sidewalls 150S of the first gate dielectric 150. The semiconductor structure also comprises a second field effect transistor 200T located in a second device region (such as the second device region 200) of the substrate 8 and comprising second active regions (such as the second active regions (234, 244)) laterally spaced from each other by a second semiconductor channel 252, a second gate dielectric 250 overlying the second semiconductor channel 252 and the second active regions (such as the second active regions (234, 244)) including a pair of discrete gate-dielectric openings 250O therethrough that overlie a respective one of the second active regions (such as the second active regions (234, 244)), and a second gate spacer 260 comprising a contoured portion that overlies a portion of the top surface of the second gate electrode 255 and that laterally surrounds the second gate electrode 255; and horizontally-extending portions that overlie the second active regions (such as the second active regions (234, 244)) and including a pair of discrete gate-spacer openings 260O therethrough that overlie the pair of discrete gate-dielectric openings 250O.

In one embodiment, the first active regions (133, 143) are laterally spaced from each other by the first semiconductor channel 152 along a first channel direction (such as the first horizontal direction hd1); and the first laterally-straight outer sidewalls (160S, 560S) laterally extend straight along a horizontal direction (such as the second horizontal direction hd2) that is perpendicular to the first channel direction (such as the first horizontal direction hd1).

In one embodiment, the semiconductor structure further comprises shallow trench isolation structures 20 located in an upper portion of the substrate 8 and comprising a first opening in the first device region (such as the first device region 100 or the fifth device region 500) and comprising a second opening in the second device region (such as the second device region 200), wherein the first opening laterally surrounds the first active regions (133, 143) and the second opening laterally surrounds the second active regions (such as the second active regions (234, 244)). In one embodiment, the horizontally-extending portions of the second gate spacer 260 extend over and contact a top surface segment of the shallow trench isolation structures 20. In one embodiment, each of the pair of discrete gate-dielectric openings 250O is laterally offset from, and does not have any areal overlap in a top-down view with, the shallow trench isolation structures 20.

In one embodiment, each discrete gate-dielectric opening 250O of the pair of discrete gate-dielectric openings 250O has a respective top periphery that coincides with a bottom periphery a of respective discrete gate-spacer opening 260O of the pair of discrete gate-spacer openings 260O of the second gate spacer 260.

In one embodiment, the semiconductor structure comprises: a planarization dielectric layer 70 overlying and contacting each of the first gate spacer (160, 560) and the second gate spacer 260; first active-region contact via structures (82, 88) contacting the planarization dielectric layer 70 and electrically connected to a respective one of the first active regions (133, 143); and second active-region contact via structures (82, 88) contacting the planarization dielectric layer 70 and electrically connected to a respective one of the second active regions (such as the second active regions (234, 244)). In one embodiment, each of the second active-region contact via structures (82, 88) vertically extends through a respective discrete gate-dielectric opening 250O of the pair of discrete gate-dielectric openings 250O, and vertically extends through a respective discrete gate-spacer opening 260O of the pair of discrete gate-spacer openings 260O.

In one embodiment, the semiconductor structure comprises: first metal-semiconductor alloy regions (136, 146) contacting a respective one of the first active regions (133, 143), a respective one of the first laterally-straight outer sidewalls (160S, 560S) of the first gate spacer (160, 560), and a bottom surface of a respective one of the first active-region contact via structures (82, 88); and second metal-semiconductor alloy regions (236, 246) contacting a respective one of the second active regions (such as the second active regions (234, 244)), a bottom periphery of a respective discrete gate-dielectric opening 250O of the pair of discrete gate-dielectric openings 250O, and a bottom surface of a respective one of the second active-region contact via structures (82, 88). In one embodiment, a third metal-semiconductor alloy region 254 is located in a top portion of the second gate electrode 255; and a gate contact via structure 85 extends through an opening in the contoured portion of the second gate spacer 260 and contacts the third metal-semiconductor alloy region 254.

In one embodiment, the semiconductor structure comprises shallow trench isolation structures 20 located in an upper portion of the substrate 8, wherein: the first metal-semiconductor alloy regions (136, 146) are in contact with the shallow trench isolation structures 20; and the second metal-semiconductor alloy regions are not in contact with the shallow trench isolation structures 20. In one embodiment, each of the first gate spacer (160, 560) and the second gate spacer 260 comprises a respective dielectric layer stack of a silicon oxide layer and a silicon nitride layer, wherein the silicon oxide layers in the first gate spacer (160, 560) and the second gate spacer 260 have a same first thickness, and the silicon nitride layers in the first gate spacer (160, 560) and the second gate spacer 260 have a same second thickness.

In one embodiment, the semiconductor structure comprises a low voltage third field effect transistor 300T located in a third device region 300 of the substrate 8 and comprising third active regions (334, 344) laterally spaced from each other by a third semiconductor channel 352, a third gate dielectric 350 overlying the third semiconductor channel and the third active regions (334, 344)) having a smaller thickness than a thickness of the first gate dielectric 150 and the second gate dielectric 250.

Referring to FIGS. 1B to 13B and according to additional embodiments of the present disclosure, a semiconductor structure comprises a first field effect transistor (100T, 500T) located over a substrate 8 in a first device region (such as the first device region 100 or the fifth device region 500) and comprising first active regions (133, 143) laterally spaced from each other by a first semiconductor channel 152, a first gate dielectric 150 overlying the first semiconductor channel 152, a first gate electrode (155 or 151) overlying the first gate dielectric 150, and a first gate spacer (160, 560) having first laterally-straight outer sidewalls (160S, 560S) that have first laterally-straight bottom edges that coincide with top edges of first laterally-straight sidewalls 150S of the first gate dielectric 150; and a second field effect transistor 400T located in a second device region (such as the fourth device region 400) of the substrate 8 and comprising second active regions (such as the fourth active regions (434, 444)) laterally spaced from each other by a second semiconductor channel 452, a second gate dielectric (such as the fourth gate dielectric 450) overlying the second semiconductor channel 452 and the second active regions (such as the fourth active regions (434, 444)), a second gate electrode (such as the fourth gate electrode 455) that overlies the second gate dielectric (such as the fourth gate dielectric 450), and a second gate spacer 460. Referring to FIG. 11B, the second gate spacer 460 comprises a first portion 460A located on a first side (e.g., left side in FIG. 11B) of the second gate electrode 455 and having a second laterally-straight outer sidewall that has a first laterally-straight bottom edge that coincides with a top edge of a second laterally-straight sidewall of the second gate dielectric 450. The second gate spacer 460 also comprises a second portion located 460B on a second side (e.g., the right side in FIG. 11B) of the second gate electrode 455 and having a contoured portion that overlies a portion of a top surface of the second side of the second gate electrode 455 and that laterally surrounds the second gate electrode 455, and a horizontally-extending portion that overlies one of the second active regions 444 and including a discrete gate-spacer opening 460O therethrough that overlies a discrete gate-dielectric opening 450O through the second gate dielectric 450.

In one embodiment, the first active regions (133, 143) are laterally spaced from each other by the first semiconductor channel 152 along a first channel direction (such as the first horizontal direction hd1); and the first laterally-straight outer sidewalls (160S, 560S) laterally extend straight along a horizontal direction (such as the second horizontal direction hd2) that is perpendicular to the first channel direction (such as the first horizontal direction hd1).

In one embodiment, the second active regions (such as the fourth active regions (434, 444)) are laterally spaced from each other by the second semiconductor channel 452 along a second channel direction (such as the first horizontal direction hd1); and the second laterally-straight sidewall 450S laterally extends straight along a horizontal direction (such as the second horizontal direction hd2) that is perpendicular to the second channel region.

In one embodiment, the semiconductor structure comprises shallow trench isolation structures 20 located in an upper portion of the substrate 8 and comprising a first opening in the first device region (such as the first device region 100 or the fifth device region 500) and comprising a second opening in the second device region (such as the fourth device region 400), wherein the first opening laterally surrounds the first active regions (133, 143) and the second opening laterally surrounds the second active regions (such as the fourth active regions (434, 444)). In one embodiment, the horizontally-extending portion of the second gate spacer 460 extends over a top surface segment of the shallow trench isolation structures 20. In one embodiment, the discrete gate-dielectric opening 450O is laterally offset from, and does not have any areal overlap in a top-down view with, the shallow trench isolation structures 20.

In one embodiment, the discrete gate-dielectric opening 450O has a top periphery that coincides with a bottom periphery of the discrete gate-spacer opening (such as the second gate-spacer opening 460O) of the second gate spacer (such as the fourth gate spacer 460).

In one embodiment, the semiconductor structure further comprises: a planarization dielectric layer 70 overlying and contacting each of the first gate spacer (160, 560) and the second gate spacer (such as the fourth gate spacer 460); first active-region contact via structures (82, 88) contacting the planarization dielectric layer 70 and electrically connected to a respective one of the first active regions (133, 143); and second active-region contact via structures (82, 88) contacting the planarization dielectric layer 70 and electrically connected to a respective one of the second active regions (such as the fourth active regions (434, 444)).

In one embodiment, the semiconductor structure comprises: first metal-semiconductor alloy regions (136, 146) contacting a respective one of the first active regions (133, 143), a respective one of the first laterally-straight outer sidewalls (160S, 560S) of the first gate spacer (160, 560), and a bottom surface of a respective one of the first active-region contact via structures (82, 88); and second metal-semiconductor alloy regions (436, 446) contacting a respective one of the second active regions (such as the fourth active regions (434, 444)) and a bottom surface of a respective one of the second active-region contact via structures (82, 88). In one embodiment, the semiconductor structure comprises shallow trench isolation structures 20 located in an upper portion of the substrate 8, wherein: the first metal-semiconductor alloy regions (136, 146) and one of the second metal-semiconductor alloy regions 436 are in contact with the shallow trench isolation structures 20; and another of the second metal-semiconductor alloy regions 446 is not in contact with the shallow trench isolation structures 20.

In one embodiment, a third metal-semiconductor alloy region 456 is located in a top portion of the second gate electrode 455; and a gate contact via structure 85 extends through the second gate spacer and contacts the third metal-semiconductor alloy region 456.

In one embodiment, each of the first gate spacer (160, 560) and the second gate spacer (such as the fourth gate spacer 460) comprises a respective dielectric layer stack of a silicon oxide layer and a silicon nitride layer, wherein the silicon oxide layers in the first gate spacer (160, 560) and the second gate spacer (such as the fourth gate spacer 460) have a same first thickness, and the silicon nitride layers in the first gate spacer (160, 560) and the second gate spacer (such as the fourth gate spacer 460) have a same second thickness.

In one embodiment, the semiconductor structure further comprises a third field effect transistor 200T located in a third device region (such as the second device region 200) of the substrate 8 and comprising third active regions (such as the second active regions (234, 244)) laterally spaced from each other by a third semiconductor channel 252, a third gate dielectric (such as the second gate dielectric 250) overlying the third semiconductor channel 252 and the third active regions (such as the second active regions (234, 244)) and including a pair of additional discrete gate-dielectric openings 250O therethrough that overlie a respective one of the third active regions, a third gate electrode 255 overlying the third gate dielectric 250, and a third gate spacer (such as the second gate spacer 260) comprising an additional contoured portion that overlies portion of a top surface of the third gate electrode 255 and laterally surrounds the third gate electrode 255, and additional horizontally-extending portions that overlie the third active regions and including a pair of additional discrete gate-spacer openings 260O therethrough that overlie pair of additional discrete gate-dielectric openings 250O.

In one embodiment, the first and the third field effect transistors (500T, 200T) comprise word line switching transistors of a peripheral circuit of a memory device; and the second field effect transistor 400T comprises a bit line hook up transistor of the peripheral circuit of the memory device.

The increase in the distance between the semiconductor channel and the silicon nitride portions due to the thick gate dielectric (e.g., layer 250) reduces electron trapping and increases the reliability of device characteristics. The embodiment devices may be manufactured with a lower number of processing steps relative to previously known methods for manufacturing high voltage transistors, and thus, the manufacturing cost may be reduced. For example, formation of an intermediate silicon oxide liner and/or an intermediate silicon nitride liner is not necessary during manufacturing of the devices of some embodiments of the present disclosure.

The field effect transistors of the embodiments of the present disclosure may include metal silicide regions having a greater lateral extent than an overlying contact via structure (e.g., source or drain electrode). The non-self-aligned configuration between the metal silicide regions and the electrodes suppresses breakdowns and junction leakage current at the non-self-aligned contact regions. The metal silicide contact can provide enhanced input-output performance, while the non-self-aligned configuration of the contact structure can suppress transistor breakdowns and junction leakages. In one embodiment, a silicon nitride gate spacer can be formed in a configuration that at least partly covers a top surface of a gate electrode, and at least partially blocks metallization of a semiconductor material in a semiconductor gate electrode. A vertically-extending portion of the silicon nitride liner functions as an etch stop structure during patterning of the silicon nitride liner, and thus, an overlay variation up to the thickness of the silicon nitride liner is permitted during patterning of the silicon nitride liner.

The active-region extensions (i.e., the lightly-doped drains) can provide the benefit of voltage reduction during a high-voltage operation, and can reduce or prevent the breakdown of the field effect transistor. Junction leakage can be avoided by preventing formation of metal silicide portions directly on the active-region extensions. Vertically-extending portions of a silicon nitride liner may function as buffer structures during patterning of the openings through the silicon nitride liner for implantation of dopants into the substrate. As such, device area penalty due to the ion implantation process is minimal. Further, through use of the silicon nitride liner both as a gate spacer and as a silicide blocking layer, the total number of processing steps can be reduced during manufacture of the field effect transistors of the embodiments of the present disclosure. Metallized gate electrodes, such as gate electrodes for n-type field effect transistors, may be employed as local interconnect structures. Non-metalized gate electrodes for p-type field effect transistors may be formed without implantation of p-type dopants, and gate depletion for the p-type field effect transistors can be avoided.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
a first field effect transistor located over a substrate in a first device region and comprising first active regions laterally spaced from each other by a first semiconductor channel, a first gate dielectric overlying the first semiconductor channel, a first gate electrode overlying the first gate dielectric, and a first gate spacer having first laterally-straight outer sidewalls that have first laterally-straight bottom edges that coincide with top edges of first laterally-straight sidewalls of the first gate dielectric; and
a second field effect transistor located in a second device region of the substrate and comprising second active regions laterally spaced from each other by a second semiconductor channel, a second gate dielectric overlying the second semiconductor channel and the second active regions, a second gate electrode overlying the second gate dielectric, and a second gate spacer comprising:
a first portion located on a first side of the second gate electrode and having a second laterally-straight outer sidewall that has a first laterally-straight bottom edge that coincides with a top edge of a second laterally-straight sidewall of the second gate dielectric; and
a second portion located on a second side of the second gate electrode and having a contoured portion that overlies a portion of a top surface of the second side of the second gate electrode and that laterally surrounds the second gate electrode, and a horizontally-extending portion that overlies one of the second active regions and including a discrete gate-spacer opening therethrough that overlies a discrete gate-dielectric opening through the second gate dielectric.

2. The semiconductor structure of claim 1, wherein:
the first active regions are laterally spaced from each other by the first semiconductor channel along a first channel direction; and
the first laterally-straight outer sidewalls laterally extend straight along a horizontal direction that is perpendicular to the first channel direction.

3. The semiconductor structure of claim 1, wherein:
the second active regions are laterally spaced from each other by the second semiconductor channel along a second channel direction; and
the second laterally-straight outer sidewall laterally extends straight along a horizontal direction that is perpendicular to the second channel region.

4. The semiconductor structure of claim 1, further comprising shallow trench isolation structures located in an upper portion of the substrate and comprising a first opening in the first device region and comprising a second opening in the second device region, wherein the first opening laterally surrounds the first active regions and the second opening laterally surrounds the second active regions.

5. The semiconductor structure of claim 4, wherein the horizontally-extending portion of the second gate spacer extends over a top surface segment of the shallow trench isolation structures.

6. The semiconductor structure of claim 4, wherein the discrete gate-dielectric opening is laterally offset from and does not have any areal overlap in a top-down view with the shallow trench isolation structures.

7. The semiconductor structure of claim 1, wherein the discrete gate-dielectric opening has a top periphery that coincides with a bottom periphery of the discrete gate-spacer opening of the second gate spacer.

8. The semiconductor structure of claim 1, further comprising:
a planarization dielectric layer overlying and contacting each of the first gate spacer and the second gate spacer;
first active-region contact via structures contacting the planarization dielectric layer and electrically connected to a respective one of the first active regions; and second active-region contact via structures contacting the planarization dielectric layer and electrically connected to a respective one of the second active regions.

9. The semiconductor structure of claim 8, further comprising:
first metal-semiconductor alloy regions contacting a respective one of the first active regions, a respective one of the first laterally-straight outer sidewalls of the first gate spacer, and a bottom surface of a respective one of the first active-region contact via structures; and
second metal-semiconductor alloy regions contacting a respective one of the second active regions and a bottom surface of a respective one of the second active-region contact via structures.

10. The semiconductor structure of claim 9, further comprising shallow trench isolation structures located in an upper portion of the substrate, wherein:
the first metal-semiconductor alloy regions and one of the second metal-semiconductor alloy regions are in contact with the shallow trench isolation structures; and
another of the second metal-semiconductor alloy regions is not in contact with the shallow trench isolation structures.

11. The semiconductor structure of claim 9, further comprising:
a third metal-semiconductor alloy region located in a top portion of the second gate electrode; and
a gate contact via structure extending through the second gate spacer and contacting the third metal-semiconductor alloy region.

12. The semiconductor structure of claim 1, wherein each of the first gate spacer and the second gate spacer comprises a respective dielectric layer stack of a silicon oxide layer and a silicon nitride layer, wherein the silicon oxide layers in the first gate spacer and the second gate spacer have a same first thickness, and the silicon nitride layers in the first gate spacer and the second gate spacer have a same second thickness.

13. The semiconductor structure of claim 1, further comprising a third field effect transistor located in a third device region of the substrate and comprising third active regions laterally spaced from each other by a third semiconductor channel, a third gate dielectric overlying the third semiconductor channel and the third active regions and including a pair of additional discrete gate-dielectric openings therethrough that overlie a respective one of the third active regions, a third gate electrode overlying the third gate dielectric, and a third gate spacer.

14. The semiconductor structure of claim 13, wherein the third gate spacer comprises:
an additional contoured portion that overlies a portion of a top surface of the third gate electrode and laterally surrounds the third gate electrode; and
additional horizontally-extending portions that overlie the third active regions and including a pair of additional discrete gate-spacer openings therethrough that overlie the pair of additional discrete gate-dielectric openings.

15. The semiconductor structure of claim 13 wherein:
the first and the third field effect transistors comprise word line switching transistors of a peripheral circuit of a memory device; and
the second field effect transistor comprises a bit line hook up transistor of the peripheral circuit of the memory device.

16. A method of forming a semiconductor structure, comprising:
forming shallow trench isolation structures in an upper portion of a semiconductor substrate;
forming a first gate dielectric, a second gate dielectric, first active-region extensions, and second active-region extensions in the upper portion of the semiconductor substrate;
forming a first gate electrode and a second gate electrode over the first gate dielectric and the second gate dielectric, respectively;
conformally forming at least one gate spacer layer over the first gate electrode and the second gate electrode; and
patterning the at least one gate spacer layer, the first gate dielectric, and the second gate dielectric to form a first gate spacer and a second gate spacer,
wherein:
a remaining portion of the first gate dielectric comprises two first laterally-straight sidewalls that laterally extend over and overlie the first active-region extensions and are vertically coincident with two first laterally-straight outer sidewalls of the first gate spacer; and
a remaining portion of the second gate dielectric comprises:
a second laterally-straight sidewall that laterally extends over and overlies one of the second active-region extensions and is vertically coincident with a second laterally-straight outer sidewall of the second gate spacer; and
a discrete gate-dielectric opening that underlies a discrete gate-spacer opening in the second gate spacer and overlies another one of the second active-region extensions.

17. The method of claim 16, further comprising forming a first patterned photoresist layer over the at least one gate spacer layer, wherein the first patterned photoresist layer covers an entirety of the second active-region extensions, the second gate dielectric, and the second gate electrode.

18. The method of claim 17, further comprising forming first active regions in the first active-region extensions by implanting dopants of a first conductivity type employing the first patterned photoresist layer as a component of a first ion implantation mask structure.

19. The method of claim 18, further comprising forming a second patterned photoresist layer over the at least one gate spacer layer, wherein the second patterned photoresist layer covers an entirety of the first active-region extensions, the first gate dielectric, and the first gate electrode, and does not cover the second active-region extensions.

20. The method of claim 19, further comprising forming second active regions in the second active-region extensions by implanting dopants of a second conductivity type employing the second patterned photoresist layer as a component of a second ion implantation mask structure.

* * * * *